(12) United States Patent
Sadaka

(10) Patent No.: US 8,697,493 B2
(45) Date of Patent: Apr. 15, 2014

(54) BONDING SURFACES FOR DIRECT BONDING OF SEMICONDUCTOR STRUCTURES

(75) Inventor: Mariam Sadaka, Austin, TX (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/185,044

(22) Filed: Jul. 18, 2011

(65) Prior Publication Data
US 2013/0020704 A1    Jan. 24, 2013

(51) Int. Cl.
*H01L 21/00* (2006.01)

(52) U.S. Cl.
USPC ........... 438/108; 438/107; 438/455; 257/777; 257/E21.499

(58) Field of Classification Search
USPC .................. 257/741, 432, E21.567, E21.505, 257/E21.506, E23.04, 786, 782, 23.04; 438/455, 108, 109, 118, 119, 598, 613, 438/106
See application file for complete search history.

(56) References Cited

U.S. PATENT DOCUMENTS

| | | | |
|---|---|---|---|
| 6,962,835 B2 | 11/2005 | Tong et al. | |
| 6,989,314 B2 * | 1/2006 | Rayssac et al. | 438/406 |
| 8,076,177 B2 * | 12/2011 | Chen et al. | 438/106 |
| 2004/0178819 A1 | 9/2004 | New | |
| 2007/0232023 A1 | 10/2007 | Tong et al. | |
| 2008/0213997 A1 | 9/2008 | Lee et al. | |
| 2010/0096760 A1 * | 4/2010 | Yu et al. | 257/774 |
| 2010/0258890 A1 * | 10/2010 | Ahn | 257/432 |
| 2010/0308455 A1 * | 12/2010 | Kim et al. | 257/734 |

OTHER PUBLICATIONS

Chattopadhyay et al., In-situ Formation of a Copper Silicide Cap for TDDB and Electromigration Improvement, 44th Annual International Reliability Physics Symposium, San Jose, 2006, pp. 128-130.
Chen et al., Microstructure Evolution and Abnormal Grain Growth During Copper Wafer Bonding, Applied Physics Letters, vol. 81, No. 20, Nov. 11, 202, pp. 3774-3776.
Gambino et al., Yield and Reliability of Cu Capped with CoWP Using a Self-Activated Process, Microelectronic Engineering, vol. 83, Issues 11-12, Nov.-Dec. 2006, pp. 2059-2067.
Gambino et al., Copper Interconnect Technology for the 32 nm Node and Beyond, IEEE 2009 Custom Intergrated Circuits Conference (CICC), 2009, pp. 141-148.

(Continued)

*Primary Examiner* — Meiya Li
*Assistant Examiner* — Lauren R Bell
(74) *Attorney, Agent, or Firm* — TraskBritt

(57) ABSTRACT

Methods of directly bonding a first semiconductor structure to a second semiconductor structure include directly bonding at least one device structure of a first semiconductor structure to at least one device structure of a second semiconductor structure in a conductive material-to-conductive material direct bonding process. In some embodiments, at least one device structure of the first semiconductor structure may be caused to project a distance beyond an adjacent dielectric material on the first semiconductor structure prior to the bonding process. In some embodiments, one or more of the device structures may include a plurality of integral protrusions that extend from a base structure. Bonded semiconductor structures are fabricated using such methods.

13 Claims, 10 Drawing Sheets

(56) References Cited

OTHER PUBLICATIONS

Gan et al., Effect of Passivation on Stress Relaxation in Electroplated Copper Films, J. Mater. Res., vol. 21, No. 6, Jun. 2006, pp. 1512-1518.

Lambert et al., Study of CMOS-Compatible Copper Etching for Organic Coating, vol. 25, Issue 5—Oct. 4-Oct. 9, 2009, 1 page.

Lu et al., Failure by Simultaneous Grain Growth, Strain Localization, and Interface Debonding in Metal Films on Polymer Substrates, J. Mater. Res., vol. 24, No. 2, Feb. 2009, pp. 379-385.

Yokogawa et al., Tradeoff Characteristics Between Resistivity and Reliability for Scaled-Down Cu-Based Interconnects, IEEE Transactions on Electron Devices, vol. 55, No. 1, Jan. 2008, pp. 350-357.

French Preliminary Search Report for French Application No. 1156874 dated Mar. 30, 2012, 3 pages.

French Written Opinion for French Application No. 1156874 dated Mar. 30, 2012, 6 pages.

Korean Preliminary Rejection for Korean Application No. 10-2012-0078214 dated Sep. 10, 2013, 8 pages including translation.

\* cited by examiner

BONDING SURFACES FOR DIRECT BONDING OF SEMICONDUCTOR STRUCTURES

TECHNICAL FIELD

The present invention relates to methods of directly bonding together semiconductor structures, and to bonded semiconductor structures formed using such methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device foot print. See, for example, P. Garrou, et al., "The Handbook of 3D Integration," Wiley-VCH (2008).

The 3D integration of semiconductor structures may take place by the attachment of a semiconductor die to one or more additional semiconductor dies (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

The bonding techniques used in bonding one semiconductor structure to another semiconductor structure may be categorized in different ways, one being whether a layer of intermediate material is provided between the two semiconductor structures to bond them together, and the second being whether the bonding interface allows electrons (i.e., electrical current) to pass through the interface. So called "direct bonding methods" are methods in which a direct solid-to-solid chemical bond is established between two semiconductor structures to bond them together without using an intermediate bonding material between the two semiconductor structures to bond them together. Direct metal-to-metal bonding methods have been developed for bonding metal material at a surface of a first semiconductor structure to metal material at a surface of a second semiconductor structure.

Direct metal-to-metal bonding methods may also be categorized by the temperature range in which each is carried out. For example, some direct metal-to-metal bonding methods are carried out at relatively high temperatures resulting in at least partial melting of the metal material at the bonding interface. Such direct bonding processes may be undesirable for use in bonding processed semiconductor structures that include one or more device structures, as the relatively high temperatures may adversely affect the earlier formed device structures.

"Thermo-compression bonding" methods are direct bonding methods in which pressure is applied between the bonding surfaces at elevated temperatures between two hundred degrees Celsius (200° C.) and about five hundred degrees Celsius (500° C.), and often between about three hundred degrees Celsius (300° C.) and about four hundred degrees Celsius (400° C.).

Additional direct bonding methods have been developed that may be carried out at temperatures of two hundred degrees Celsius (200° C.) or less. Such direct bonding processes carried out at temperatures of two hundred degrees Celsius (200° C.) or less are referred to herein as "ultra-low temperature" direct bonding methods. Ultra-low temperature direct bonding methods may be carried out by careful removal of surface impurities and surface compounds (e.g., native oxides), and by increasing the area of intimate contact between the two surfaces at the atomic scale. The area of intimate contact between the two surfaces is generally accomplished by polishing the bonding surfaces to reduce the surface roughness up to values close to the atomic scale, by applying pressure between the bonding surfaces resulting in plastic deformation, or by both polishing the bonding surfaces and applying pressure to attain such plastic deformation.

Some ultra-low temperature direct bonding methods may be carried out without applying pressure between the bonding surfaces at the bonding interface, although pressure may be applied between the bonding surfaces at the bonding interface in other ultra-low temperature direct bonding methods in order to achieve a suitable bond strength at the bonding interface. Ultra-low temperature direct bonding methods in which pressure is applied between the bonding surfaces are often referred to in the art as "surface assisted bonding" or "SAB" methods. Thus, as used herein, the terms "surface assisted bonding" and "SAB" mean and include any direct bonding process in which a first material is directly bonded to a second material by abutting the first material against the second material and applying pressure between the bonding surfaces at the bonding interface at a temperature of two hundred degrees Celsius (200° C.) or less.

Direct metal-to-metal bonds between active conductive features in semiconductor structures may, in some instances, be prone to mechanical failure or electrical failure after a period of time even though an acceptable direct metal-to-metal bond may be initially established between the conductive features of the semiconductor structures. Although not fully understood, it is believed that such failure may be at least partially caused by one or more of three related mechanisms. The three related mechanisms are strain localization, which may be promoted by large grains, deformation-associated grain growth, and mass transport at the bonding interface. Such mass transport at the bonding interface may be at least partially due to electromigration, phase segregation, etc.

Electromigration is the migration of metal atoms in a conductive material due to an electrical current. Various methods for improving the electromigration lifetime of interconnects have been discussed in the art. For example, methods for improving the electromagnetic lifetime of copper interconnects are discussed in J. Gambino et al., "Copper Interconnect Technology for the 32 nm Node and Beyond," IEEE 2009 Custom Integrated Circuits Conference (CICC), pages 141-148.

FIGS. 1A and 1B illustrate a problem that may be encountered in direct bonding methods. Referring to FIG. 1A, a semiconductor structure 10 is illustrated that includes a device layer 12, which may comprise a plurality of device structures, although such structures are not illustrated in the simplified figures. Dielectric material 14 is disposed over the device layer 12, and a plurality of recesses 16 extend into the dielectric material 14 at locations at which it is desired to form conductive elements such as conductive pads, traces, vias, etc. Thus, electrically conductive metal 18 (e.g., copper or a copper alloy) has been deposited over the dielectric material 14 such that the conductive metal 18 fills the recesses 16. Excess conductive metal 18 is often deposited, such that a layer of the conductive metal 18 extends over the major upper surface 15 of the dielectric material 14, as shown in FIG. 1A.

After depositing the conductive metal 18 to form a semiconductor structure 10 as shown in FIG. 1A, the excess conductive metal 18 is removed from the major upper surface 15 of the dielectric material 14 to form a semiconductor structure 20 as shown in FIG. 1B. Removal of the excess conductive metal 18 defines device structures 22 that comprise the conductive metal 18 in the recesses 16. For example, a chemical-mechanical polishing (CMP) process may be used to remove the excess conductive metal 18 from the major upper surface 15 of the dielectric material 14 and define the device structures 22. The CMP process used to remove the excess conductive metal 18 from the major upper surface 15 of the dielectric material 14, however, may result in the exposed surfaces 23 of the device structures 22 being recessed relative to the surrounding major upper surface 15 of the dielectric material 14. The exposed surfaces 23 may have an arcuate, concave shape as shown in FIG. 1B. This phenomenon is often referred to in the art as "dishing." Also, the CMP process used to remove the excess conductive metal 18 from the major upper surface 15 of the dielectric material 14 also may cause excessive removal of the dielectric material 14 at certain locations, such as the locations 26 between closely separated device structures 22, as well as random locations on the major upper surface 15 of the dielectric material 14, such as the location 28 shown in FIG. 1B. Such excessive removal of the dielectric material 14 below the primary plane of the major upper surface 15 of the dielectric material 14 is often referred to in the art as "erosion." These dishing and erosion phenomena may result from non-uniformity of the CMP process, and/or non-uniformity in the initial thickness of the layer of conductive metal 18 over the major upper surface 15 of the dielectric material 14.

Dishing of the exposed surfaces 23 of the device structures 22 and localized erosion of the major upper surface 15 of the dielectric material 14 may adversely affect the strength of a bond and electrical connection subsequently established between the semiconductor structure 20 of FIG. 1B and another semiconductor structure (not shown) in a direct bonding process.

BRIEF SUMMARY

This summary is provided to introduce a selection of concepts in a simplified form that, which concepts are further described in the detailed description below of some example embodiments of the invention. This summary is not intended to identify key features or essential features of the claimed subject matter, nor is it intended to be used to limit the scope of the claimed subject matter.

In some embodiments, the present invention includes methods of directly bonding a first semiconductor structure to a second semiconductor structure. A first semiconductor structure may be provided that includes at least one device structure comprising a conductive material (e.g., a metal or a conductive non-metal material such as polycrystalline silicon, which is often referred to as "polysilicon"), and a dielectric material disposed adjacent the at least one device structure. The at least one device structure and the dielectric material may be exposed at a bonding surface of the first semiconductor structure. An exposed surface of the dielectric material at the bonding surface of the first semiconductor structure may define a bond plane of the first semiconductor structure. The at least one device structure of the first semiconductor structure may be caused to project a distance from the bond plane of the first semiconductor structure beyond the adjacent dielectric material. A second semiconductor structure may be provided that includes at least one device structure comprising a conductive material, and a dielectric material disposed adjacent the at least one device structure. The at least one device structure and the dielectric material may be exposed at a bonding surface of the second semiconductor structure. An exposed surface of the dielectric material at the bonding surface of the second semiconductor structure may define a bond plane of the second semiconductor structure. The at least one device structure of the first semiconductor structure may be bonded directly to the at least one device structure of the second semiconductor structure in a metal-to-metal direct bonding process.

Additional embodiments of methods of directly bonding a first semiconductor structure to a second semiconductor structure include providing a first semiconductor structure, providing a second semiconductor structure, and bonding a plurality of integral protrusions of at least one device structure of the first semiconductor structure directly to a plurality of integral protrusions of the at least one device structure of the second semiconductor structure in a conductive material-to-conductive material direct bonding process (e.g., metal-to-metal, polysilicon-to-polysilicon, polysilicon-to-metal, etc.). The first semiconductor structure may comprise the at least one device structure, which may comprise a conductive material, and a dielectric material disposed adjacent the at least one device structure. The at least one device structure includes a plurality of integral protrusions extending from a base structure. The plurality of integral protrusions and the dielectric material are exposed at a bonding surface of the first semiconductor structure. The dielectric material extends over a portion of the at least one device structure between the integral protrusions of the at least one device structure. An exposed surface of the dielectric material at the bonding surface of the first semiconductor structure defines a bond plane of the first semiconductor structure. The second semiconductor structure also includes at least one device structure, which may comprise a conductive material, and a dielectric material disposed adjacent the at least one device structure. The at least one device structure comprises a plurality of integral protrusions extending from a base structure. The plurality of integral protrusions and the dielectric material are exposed at a bonding surface of the second semiconductor structure. The dielectric material of the second semiconductor structure extends over a portion of the at least one device structure between the integral protrusions of the plurality of integral protrusions of the at least one device structure of the second semiconductor structure. An exposed surface of the dielectric material at the bonding surface of the second semiconductor structure defines a bond plane of the second semiconductor structure.

In additional embodiments, the present invention includes bonded semiconductor structures. The bonded semiconductor structures include a first semiconductor structure bonded to a second semiconductor structure. The first semiconductor structure includes at least one conductive device structure at a bonding surface of the first semiconductor structure, and a dielectric material disposed adjacent the at least one conductive device structure at the bonding surface of the first semiconductor structure. The second semiconductor structure also includes at least one conductive device structure at a bonding surface of the second semiconductor structure, and a dielectric material disposed adjacent the at least one conductive device structure at the bonding surface of the second semiconductor structure. The at least one conductive device structure of the second semiconductor structure is directly bonded to the at least one conductive device structure of the first semiconductor structure along a bonding interface therebetween. The dielectric material of the second semiconductor structure abuts the dielectric material of the first semiconductor structure along a bond plane. The bonding interface between the at least one conductive device structure of the first semiconductor structure and the at least one conductive device structure of the second semiconductor structure is separated from the bond plane by a distance.

In yet further embodiments, the present invention includes additional bonded semiconductor structures that include a first semiconductor structure bonded to a second semiconductor structure. The first semiconductor structure includes at least one conductive device structure at a bonding surface of the first semiconductor structure, and a dielectric material disposed adjacent the at least one conductive device structure at the bonding surface of the first semiconductor structure. The at least one conductive device structure includes a plurality of integral protrusions extending from a base structure, and at least a portion of the dielectric material is disposed between the integral protrusions of the at least one conductive device structure. The second semiconductor structure also includes at least one conductive device structure at a bonding surface of the second semiconductor structure, and a dielectric material disposed adjacent the at least one conductive device structure at the bonding surface of the second semiconductor structure. The at least one conductive device structure comprises a plurality of integral protrusions extending from a base structure, and at least a portion of the dielectric material is disposed between the integral protrusions of the at least one conductive device structure of the second semiconductor structure. The dielectric material of the second semiconductor structure abuts the dielectric material of the first semiconductor structure along a bond plane. The integral protrusions of the at least one conductive device structure of the first semiconductor structure are directly bonded to the integral protrusions of the at least one conductive device structure of the second semiconductor structure along bonded interfaces therebetween.

BRIEF DESCRIPTION OF THE DRAWINGS

The present invention may be understood more fully by reference to the following detailed description of example embodiments of the present invention, which are illustrated in the appended figures in which.

DETAILED DESCRIPTION

Figure 1A:
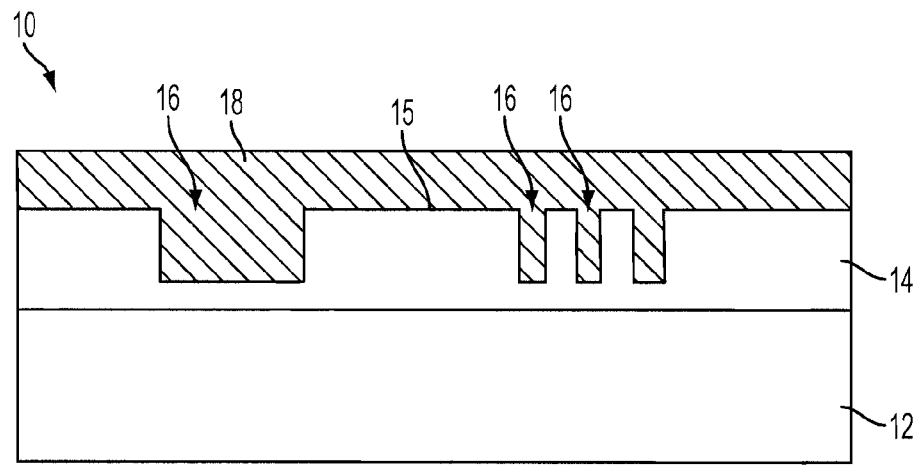
FIGS. 1A and 1B are simplified cross-sectional views of semiconductor structures, and are used to illustrate dishing and erosion phenomena that may occur during preparation of bonding surfaces of semiconductor structures for direct bonding processes used to directly bond semiconductor structures together.

The illustrations presented herein are not meant to be actual views of any particular semiconductor structure, device, system, or method, but are merely idealized representations that are used to describe embodiments of the invention.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

As used herein, the term "semiconductor structure" means and includes any structure that is used in the formation of a semiconductor device. Semiconductor structures include, for example, dies and wafers (e.g., carrier substrates, interposers, and device substrates), as well as assemblies or composite structures that include two or more dies, wafers, or combinations thereof that have been three-dimensionally integrated with one another. Semiconductor structures also include fully fabricated semiconductor devices, as well as intermediate structures formed during fabrication of semiconductor devices.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures. Furthermore, bonded semiconductor structures that include one or more processed semiconductor structures are also processed semiconductor structures.

As used herein, the term "device structure" means and includes any portion of a processed semiconductor structure that is, includes, or defines at least a portion of an active or passive component of a semiconductor device to be formed on or in the semiconductor structure. For example, device structures include active and passive components of integrated circuits such as transistors, transducers, capacitors, resistors, conductive lines, conductive vias, and conductive contact pads.

As used herein, the term "through wafer interconnect" or "TWI" means and includes any conductive via extending through at least a portion of a first semiconductor structure that is used to provide a structural and/or an electrical interconnection between the first semiconductor structure and a second semiconductor structure across an interface between the first semiconductor structure and the second semiconductor structure. Through wafer interconnects are also referred to in the art by other terms, such as "through silicon vias," "through substrate vias," "through wafer vias," or abbreviations of such terms, such as "TSVs" or "TWVs." TWIs typically extend through a semiconductor structure in a direction generally perpendicular to the generally flat, major surfaces of the semiconductor structure (i.e., in a direction parallel to the "Z" axis).

As used herein, the term "active surface," when used in relation to a processed semiconductor structure, means and includes an exposed major surface of the processed semiconductor structure that has been, or will be, processed to form one or more device structures in and/or on the exposed major surface of the processed semiconductor structure.

As used herein, the term "back surface," when used in relation to a processed semiconductor structure, means and includes an exposed major surface of the processed semiconductor structure on an opposing side of the processed semiconductor structure from an active surface of the semiconductor structure.

In some embodiments, the present invention comprises improved methods of directly bonding a first semiconductor structure to a second semiconductor structure to form a bonded semiconductor structure. In particular, embodiments of the invention may comprise forming a bonding surface of a semiconductor structure to have a selected topographical pattern that is purposefully rendered non-planar on the atomic scale to improve a bond to be established between the bonding surface of the semiconductor structure and a bonding surface of another semiconductor structure in a direct bonding process such as an ultra-low temperature bonding process (e.g., a surface-assisted bonding (SAB) process), without using an intermediate adhesive material between the bonding surfaces of the semiconductor structures.

A first set of example embodiments of the invention is described below with reference to FIGS. 2A through 2K. In particular, FIGS. 2A through 2D illustrate the fabrication of a first semiconductor structure 130 shown in FIG. 2D, FIGS. 2E through 2I illustrate the fabrication of a second semiconductor structure 240 shown in FIG. 2I, and FIGS. 2J and 2K illustrate the first semiconductor structure 130 and the second semiconductor structure 240 being bonded together in a direct bonding process to form a bonded semiconductor structure 300 shown in FIG. 2K.

Figure 1B:
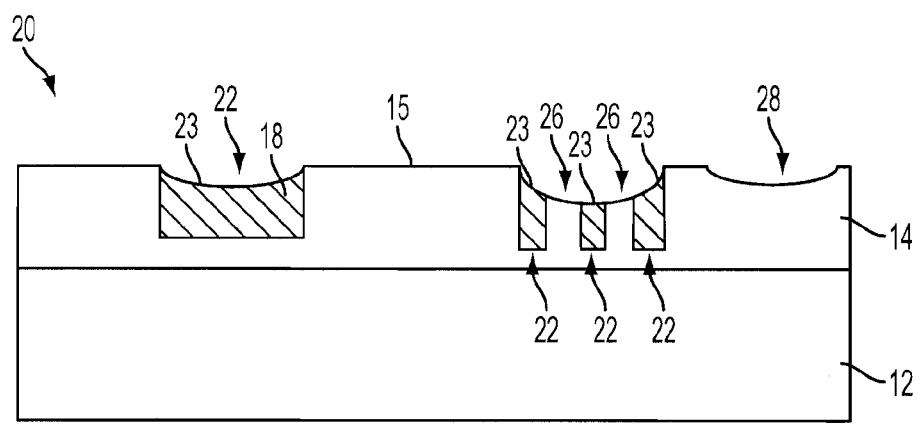
Figure 2A:
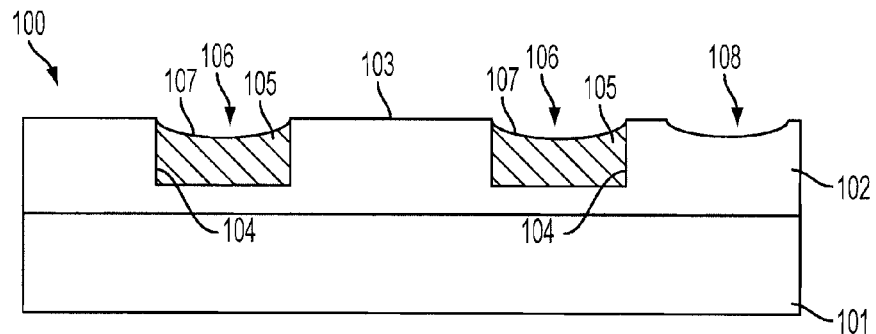
FIGS. 2A through 2K are simplified cross-sectional views of semiconductor structures and illustrate embodiments of direct bonding processes of the present invention for directly bonding together semiconductor structures.

Referring to FIG. 2A, a semiconductor structure 100 is shown, which may be formed as previously described herein with reference to FIGS. 1A and 1B. The semiconductor structure 100, like the semiconductor structure 10 of FIG. 1A, may comprise a device layer 101 that includes one or more device structures, such as, transistors, vertically extending conductive vias, horizontally extending conductive traces, etc. The semiconductor structure 100 includes device structures 106 that are defined by and comprise a conductive metal 105 that is disposed within recesses 104 formed or otherwise provided in the dielectric material 102.

The conductive material 105 may comprise a commercially pure metal element such as copper, aluminum, tungsten, tantalum, titanium, chromium, or a non-metallic conductive material such as doped polysilicon, etc., or the conductive material 105 may comprise an alloy or mixture based on one or more such metal elements. Further, the device structures 106 may comprise different regions having different compositions. For example, the recesses 104 may be lined with one or more relatively thin layers of metal to provide, for example, a diffusion barrier layer, a seed layer, etc., and bulk electrically conductive metal, such as copper or a copper alloy, may substantially fill the remaining majority of the volume of the recesses 104.

As shown in FIG. 2A, a surface 107 of the device structures 106 that is exposed through the dielectric material 102 may, in some embodiments, have a concave shape, which may result from the dishing phenomenon that has been observed upon performing a chemical-mechanical polishing (CMP) process to remove excess conductive material 105 from the semiconductor structure 100 and define the device structures 106. Thus, the surfaces 107 of the device structures 106 may be recessed relative to the adjacent surface 103 of the surrounding dielectric material 102, as shown in FIG. 2A.

As also shown in FIG. 2A, the exposed major surface 103 of the dielectric material 102 may not be perfectly planar, and may have pits or recesses at certain locations thereon. For example, a concave recess 108 is shown in the surface 103 at a location separated from the device structures 106. Such recesses 108 also may result from the chemical-mechanical polishing (CMP) process used to remove excess conductive metal 105 from the semiconductor structure 100 and define the device structures 106, which involves the removal of differing materials and, hence, may be relatively less effective at attaining a planar surface compared to CMP processes that involve the removal of only a single homogeneous material (i.e., CMP processes in which the entire surface being polished has the same composition).

Figure 2B:
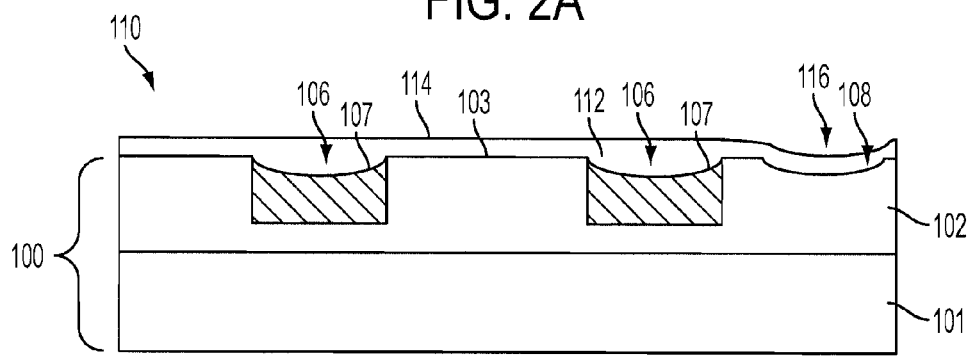

Referring to FIG. 2B, a semiconductor structure 110 may be formed from the semiconductor structure 100 of FIG. 2A by providing an additional dielectric material 112 over the surface 103 of the dielectric material 102. As shown in FIG. 2B, the additional dielectric material 112 may be provided over the dielectric material 102 to an average thickness that fills the recess 108 and the recesses defined by the concave surfaces 107 of the device structures 106. In some embodiments, the additional dielectric material 112 may be provided over the dielectric material 102, such that the average distance between the exposed major surface 114 of the additional dielectric material and the surface 103 of the underlying dielectric material 102 is at least about one hundred nanometers (100 nm), at least about five hundred nanometers (500 nm), or even at least about one thousand nanometers (1,000 nm).

The additional dielectric material may comprise, for example, an oxide material such as one or more of silicon oxide, silicon nitride, and silicon oxynitride, and may be deposited using known chemical vapor deposition (CVD) processes. The temperature at which the additional dielectric material is deposited may be selected so as not to damage previously fabricated devices.

As shown in FIG. 2B, in some embodiments, the additional dielectric material 112 may be deposited in a conformal manner over the semiconductor structure 100 of FIG. 2A, such that the exposed major surface 114 of the additional dielectric material 112 also includes one or more recesses located over recesses in the underlying surface of the semiconductor structure 100. For example, a recess 116 is shown in the exposed major surface 114 of the additional dielectric material 112 that is located over the recess 108 in the underlying surface 103 of the dielectric material 102. Although not shown in FIG. 2B, additional recesses may be formed in the exposed major surface 114 of the additional dielectric material 112 at the locations overlying the recessed surfaces 107 of the device structures 106.

Figure 2C:
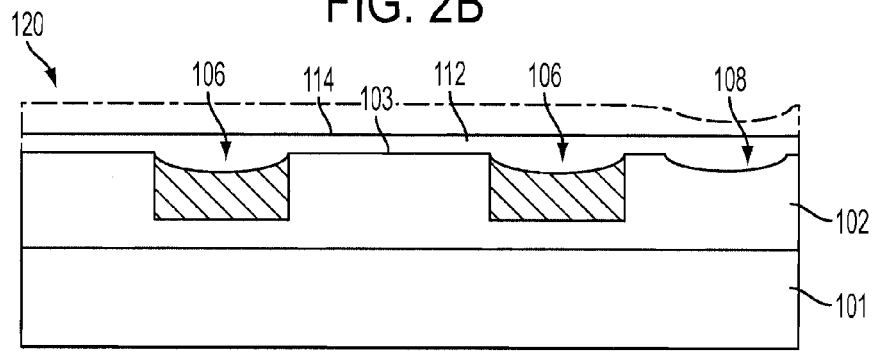

Referring to FIG. 2C, after depositing the additional dielectric material 112, the exposed major surface 114 of the additional dielectric material 112 may be planarized to form another semiconductor structure 120. For example, the exposed major surface 114 of the additional dielectric material 112 may be subjected to one or more of a chemical etching process, a mechanical polishing process, or a chemical-mechanical polishing (CMP) process to planarize the exposed major surface 114 of the additional dielectric material 112. The process used to planarize the exposed major surface 114 may involve removal of a portion of the additional dielectric material 112. Thus, the original profile of the additional dielectric material 112 is shown in FIG. 2C by a phantom line. After planarizing the exposed major surface 114 of the additional dielectric material 112, the exposed major surface 114 may be at least substantially planar (i.e., smooth). As the planarization process used to planarize the exposed major surface 114 involves planarization of an entire surface having the same composition (i.e., the composition of the additional dielectric material 112), the exposed major surface 114 may be smoother after planarization relative to the smoothness of the exposed major surface of the semiconductor structure 100 of FIG. 2A.

In some embodiments, after the planarization process, the exposed major surface 114 may have a root mean square (RMS) surface roughness of about one-half of a nanometer (0.5 nm) or less, about two tenths of a nanometer (0.2 nm) or less, or even about one tenth of a nanometer (0.1 nm) or less.

Figure 2D:
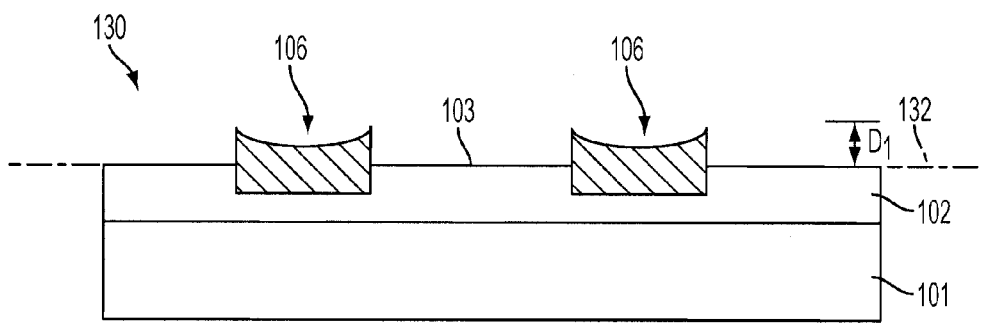

After planarizing the exposed major surface 114 of the additional dielectric material 112, the semiconductor structure 120 of FIG. 2C may be subjected to an etching process to remove the additional dielectric material 112 and a portion of the underlying dielectric material 102 to cause the device structures 106 to project a selected, predetermined distance $D_1$ from the exposed surface 103 of the dielectric material 102, as shown in FIG. 2D, and form the previously mentioned first semiconductor structure 130.

In some embodiments, the distance $D_1$ may be between about one-half of a nanometer (0.5 nm) and about fifty nanometers (50 nm), between about one nanometer (1 nm) and about ten nanometers (10 nm), or even between about two nanometers (2 nm) and about seven nanometers (7 nm).

The exposed surfaces of the device structures 106 and the exposed major surface 103 of the surrounding dielectric material 102 together define a bonding surface of the first semiconductor structure 130 that will be abutted against and bonded to a complementary bonding surface of the second semiconductor structure 240 shown in FIG. 2I.

With continued reference to FIG. 2D, the device structures 106 and the dielectric material 102 disposed adjacent the device structures 106 are exposed at the bonding surface of the first semiconductor structure 130. The exposed major surface 103 of the dielectric material 102 defines a bond plane 132 of the first semiconductor structure. The bond plane 132 may comprise the plane along which at least a majority of the bonding interface between the first semiconductor structure 130 and the second semiconductor structure 240 (FIG. 2I) extends after bonding the first semiconductor structure 130 and the second semiconductor structure 240 together, as discussed in further detail below with reference to FIGS. 2J and 2K.

An example method that may be used to form the second semiconductor structure 240 of FIG. 2I is now described with reference to FIGS. 2E through 2I.

Figure 2E:
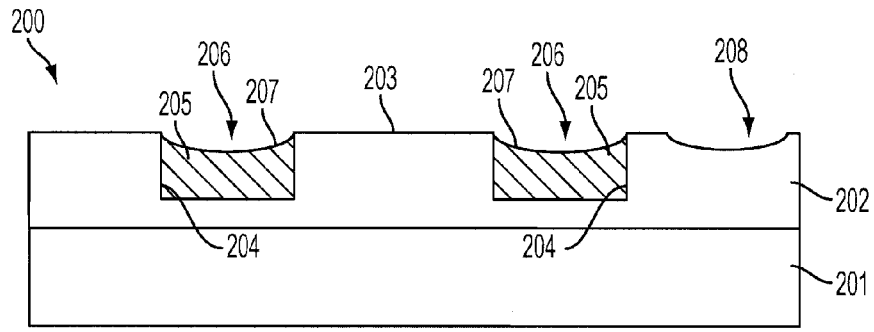

Referring to FIG. 2E, a semiconductor structure 200 may be provided. The semiconductor structure 200 may be substantially similar to the semiconductor structure 100 of FIG. 2A, and may include a device layer 201 that includes one or more device structures, such as, transistors, vertically extending conductive vias, horizontally extending conductive traces, etc. The semiconductor structure 200 includes a dielectric material 202 disposed over the device layer 201, and device structures 206 that are defined by and comprise a conductive material 205 that is disposed within recesses 204 formed or otherwise provided in the dielectric material 202. The conductive material 205 may have a composition as previously described in relation to the conductive material 105 of FIG. 2A.

As shown in FIG. 2E, a surface 207 of the device structures 206 that is exposed through the dielectric material 202 may, in some embodiments, have a concave shape, which may result from the dishing phenomenon that has been observed upon performing a chemical-mechanical polishing (CMP) process to remove excess conductive metal 205 from the semiconductor structure 200 and define the device structures 206. Thus, the surfaces 207 of the device structures 206 may be recessed relative to the adjacent surface 203 of the surrounding dielectric material 202, as shown in FIG. 2E.

As also shown in FIG. 2E, the exposed major surface 203 of the dielectric material 202 may not be perfectly planar, and may have pits or recesses at certain locations thereon. For example, a concave recess 208 is shown in the surface 203 at a location separated from the device structures 206. Such recesses 208 also may result from the chemical-mechanical polishing (CMP) process used to remove excess conductive metal 205 from the semiconductor structure 200 and define the device structures 206, as previously discussed herein.

Figure 2F:
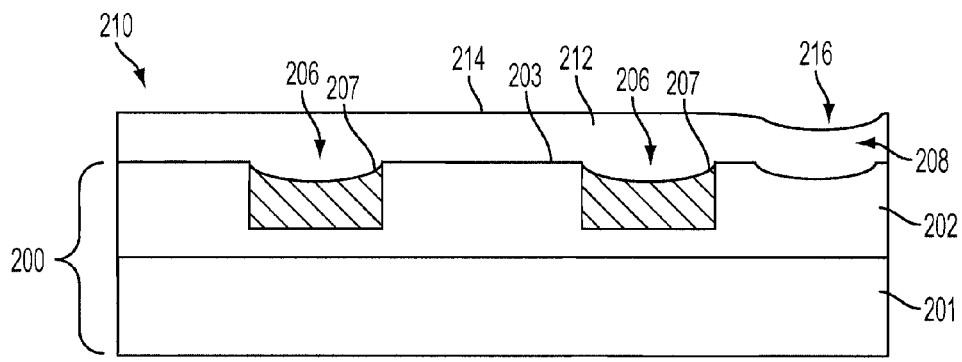

Referring to FIG. 2F, a semiconductor structure 210 may be formed from the semiconductor structure 200 of FIG. 2E by providing an additional dielectric material 212 over the surface 203 of the dielectric material 202. As shown in FIG. 2F, the additional dielectric material 212 may be provided over the dielectric material 202 to an average thickness that fills the recess 208 and the recesses defined by the concave surfaces 207 of the device structures 206. The additional dielectric material 212 may have a composition and configuration (e.g., average thickness) as previously disclosed in relation to the additional dielectric material 112 with reference to FIG. 2B.

As shown in FIG. 2F, in some embodiments, the additional dielectric material 212 may be deposited in a conformal manner over the semiconductor structure 200 of FIG. 2E, such that the exposed major surface 214 of the additional dielectric material 212 also includes one or more recesses located over recesses in the underlying surface of the semiconductor structure 200. For example, a recess 216 is shown in the exposed major surface 214 of the additional dielectric material 212 that is located over the recess 208 in the underlying surface 203 of the dielectric material 202. Although not shown in FIG. 2F, additional recesses may be formed in the exposed major surface 214 of the additional dielectric material 212 at the locations overlying the recessed surfaces 207 of the device structures 206.

Figure 2G:
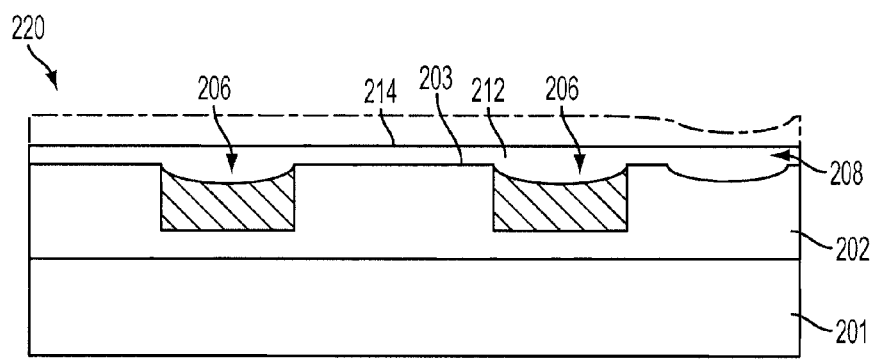

Referring to FIG. 2G, after depositing the additional dielectric material 212, the exposed major surface 214 of the additional dielectric material 212 may be planarized to form another semiconductor structure 220 in a manner like that previously described in relation to the additional dielectric material 112 with reference to FIG. 2C. For example, the exposed major surface 214 of the additional dielectric material 212 may be subjected to one or more of a chemical etching process, a mechanical polishing process, or a chemical-mechanical polishing (CMP) process to planarize the exposed major surface 214 of the additional dielectric material 212. The process used to planarize the exposed major surface 214 may involve removal of a portion of the additional dielectric material 212. Thus, the original profile of the additional dielectric material 212 is shown in FIG. 2G by a phantom line. After planarizing the exposed major surface 214 of the additional dielectric material 212, the exposed major surface 214 may be at least substantially planar (i.e., smooth). As the planarization process used to planarize the exposed major surface 214 involves planarization of an entire surface having the same composition (i.e., the composition of the additional dielectric material 212), the exposed major surface 214 may be smoother after planarization relative to the smoothness of the exposed major surface of the semiconductor structure 200 of FIG. 2E.

In some embodiments, after the planarization process, the exposed major surface 214 may have a root mean square (RMS) surface roughness of about one-half of a nanometer (0.5 nm) or less, about two tenths of a nanometer (0.2 nm) or less, or even about one tenth of a nanometer (0.1 nm) or less.

Figure 2H:
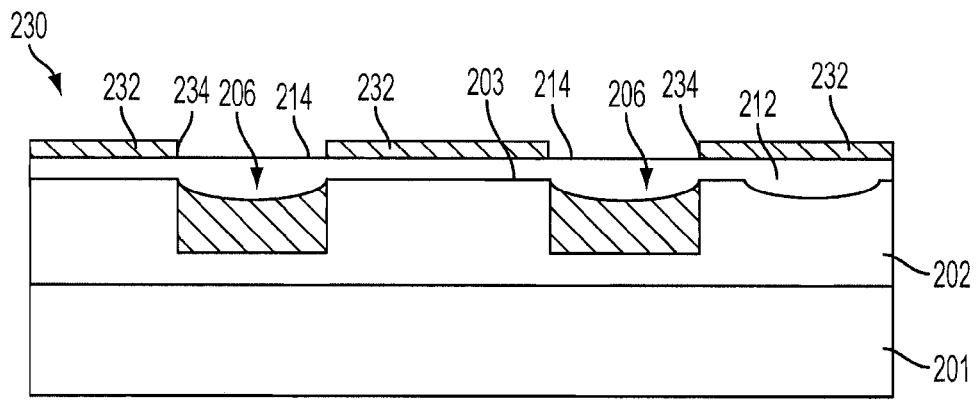
Figure 2I:
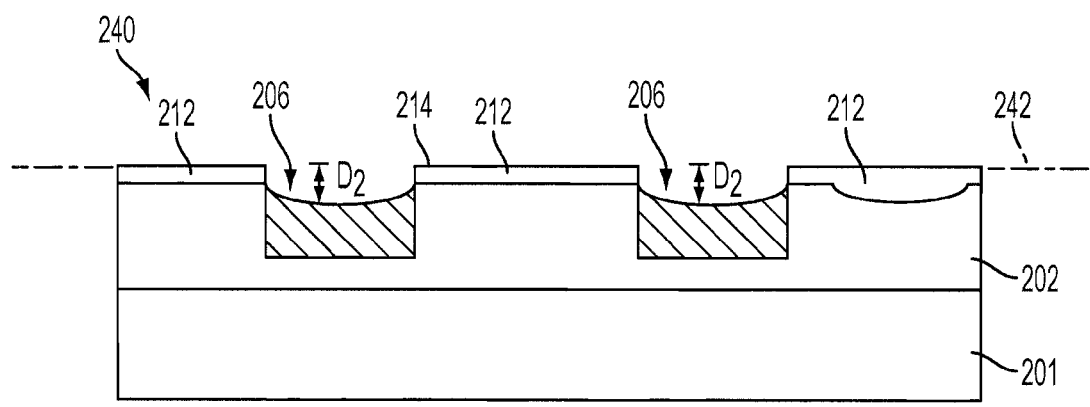
Figure 2J:
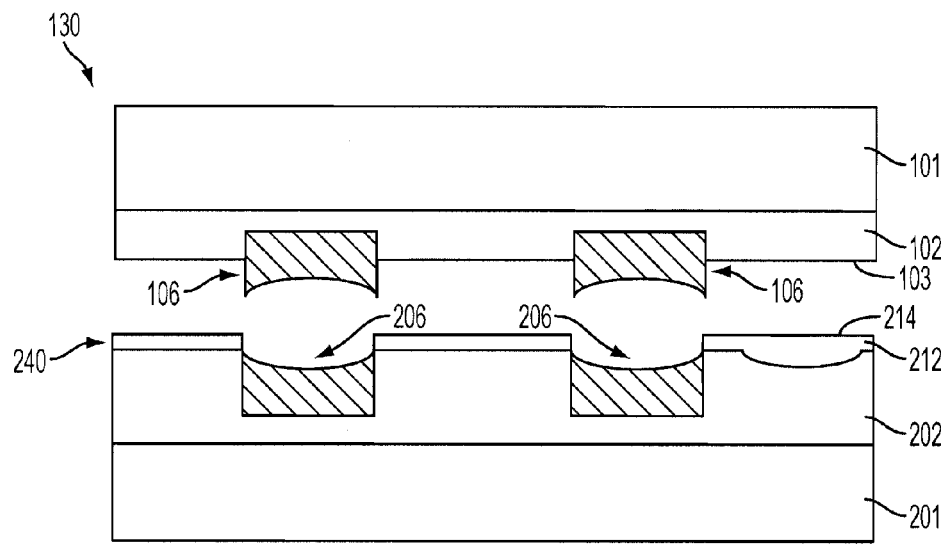
Figure 2K:
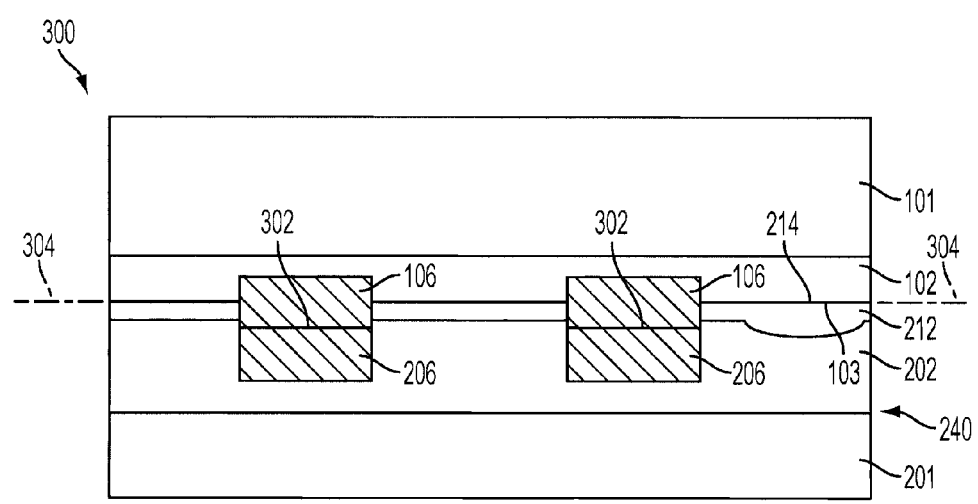

Referring to FIG. 2H, after planarizing the exposed major surface 214 of the additional dielectric material 212, a mask material 232 may be provided over the planarized exposed major surface 214. The mask material 232 may be blanket deposited over at least substantially the entire exposed major surface 214, and subsequently patterned to form apertures 234 (e.g., holes or other openings) extending through the mask material 232. The apertures 234 may be aligned with the device structures 206, as shown in FIG. 2H. Further, the apertures 234 may have sizes and shapes that correspond to the sizes and shapes of the underlying device structures 206. The patterned mask material 232 may be used to facilitate removal of the regions of the additional dielectric material 212 overlying the device structures 206 without removing other regions of the additional dielectric material 212.

The mask material 232 may comprise, for example, a polymeric photoresist material such as poly(methyl methacrylate) (PMMA), which may be deposited by spinning on a layer of uncured photoresist material, and subsequently subjecting certain selected regions of the uncured photoresist material to electromagnetic radiation through a patterned reticle to cure only selected regions of the uncured photoresist material. Uncured regions of the photoresist material then may be removed to form the patterned mask material 232 as shown in FIG. 2H. In additional embodiments, the mask material 232 may comprise a hard mask material, such as silicon nitride ($Si_3N_4$), and may be deposited using, for example, a chemical vapor deposition (CVD) process. Photolithographic techniques then may be used to pattern the deposited hard mask material to form the patterned mask material 232, as shown in FIG. 2H. Various mask materials, and methods for depositing and patterning such mask materials, are known in the art and may be employed in embodiments of the invention.

After forming the patterned mask material 232 over the planarized exposed major surface 214 of the additional dielectric material 212, the regions of the additional dielectric material 212 that are exposed through the apertures 234 in the patterned mask material 232 overlying the device structures 206 may be removed to form a semiconductor structure 240, as shown in FIG. 2I. For example, the semiconductor structure 230 of FIG. 2H may be exposed to one or more etchants in a wet chemical etching process or a dry reactive ion etching (RIE) process. The one or more etchants may be selected to have a composition that will etch the additional dielectric material 212 without removing the patterned mask material 232 and device structures 206, or that will etch the additional dielectric material 212 at a higher rate relative to the rate at which the patterned mask material 232 and device structures 206 are etched by the one or more etchants, such that at least substantially all of the additional dielectric material 212 overlying the device structures 206 may be removed by the one or more etchants without etching entirely through the patterned mask material 232.

After removing the regions of the additional dielectric material 212 overlying the device structures 206 that are exposed through the apertures 234 in the patterned mask material 232 in an etching process, the patterned mask material 232 may be removed, as shown in FIG. 2I. In some embodiments, after this etching process, the exposed major surface 214 of the additional dielectric material 212 may have a root mean square (RMS) surface roughness of about point five tenths of a nanometer (0.5 nm) or less, about two tenths of a nanometer (0.2 nm) or less, or even about one tenth of a nanometer (0.1 nm) or less.

Further, in some embodiments, the etching process used to remove the regions of the additional dielectric material 212 overlying the device structures 206 that are exposed through the apertures 234 in the patterned mask material 232 may cause the exposed surfaces 207 of the device structures 206 to be recessed a selected, predetermined distance $D_2$ from the exposed surface 214 of the surrounding additional dielectric material 212, as shown in FIG. 2I.

In some embodiments, an etching process used to remove an oxide may cause the exposed surfaces 207 of the device structures 206 to have a recessed or dished shape in embodiments in which the device structures comprise polysilicon. In additional embodiments, the device structures 206 may be caused to have a recessed or dished shape due to a chemical-mechanical polishing (CMP) process used to remove excess conductive material 205 from the semiconductor structure 200 and define the device structures 206, as previously described with reference to FIG. 2A.

As non-limiting examples, the distance $D_2$ may be between about one tenth of a nanometer (0.1 nm) and about ten nanometers (10 nm), between about one nanometer (1 nm) and about ten nanometers (10 nm), or even between about two nanometers (2 nm) and about seven nanometers (7 nm).

In some embodiments, the distance $D_2$ of FIG. 2I may be at least substantially equal to the distance $D_1$ of FIG. 2D. In additional embodiments, however, the distance $D_2$ of FIG. 2I may be less than the distance $D_1$ of FIG. 2D. For example, the distance $D_2$ of FIG. 2I may be between about 80% and about 99% of the distance $D_1$ of FIG. 2D, or more particularly, between about 90% and about 98% of the distance $D_1$ of FIG. 2D.

The exposed surfaces 207 of the device structures 206 and the exposed major surface 214 of the surrounding additional dielectric material 212 together define a bonding surface of the second semiconductor structure 240 that will be abutted against and bonded to the complementary bonding surface of the first semiconductor structure 130 of FIG. 2D.

With continued reference to FIG. 2I, the device structures 206 and the additional dielectric material 212 disposed adjacent the device structures 206 are exposed at the bonding surface of the second semiconductor structure 240. The exposed major surface 214 of the additional dielectric material 212 defines a bond plane 242 of the second semiconductor structure 240. The bond plane 242 may comprise the plane along which at least a majority of the bonding interface between the first semiconductor structure 130 (FIG. 2D) and the second semiconductor structure 240 extends after bonding the first semiconductor structure 130 and the second semiconductor structure 240 together, as discussed in further detail below with reference to FIGS. 2J and 2K.

Referring to FIG. 2J, the first semiconductor structure 130 may be aligned with the second semiconductor structure 240 such that the device structures 106 of the first semiconductor structure 130 are aligned with the device structures 206 of the second semiconductor structure 240. As previously mentioned, the exposed surfaces of the device structures 106 and the exposed major surface 103 of the surrounding dielectric material 102 together define a bonding surface of the first semiconductor structure 130, and the exposed surfaces of the device structures 206 and the exposed major surface 214 of the surrounding additional dielectric material 212 together define a bonding surface of the second semiconductor structure 240. Thus configured, the topography of the bonding surface of the first semiconductor structure 130 has a male configuration in which the device structures 106 project from the first semiconductor structure 130, and the topography of the bonding surface of the second semiconductor structure 240 has a female configuration in which the device structures 206 are disposed in recesses that extend into the second semiconductor structure 240.

Referring to FIG. 2K, the projecting device structures 106 of the first semiconductor structure 130 may be inserted into the recesses in which the device structures 206 of the second semiconductor structure 240 are disposed, and the bonding surface of the first semiconductor structure 130 may be abutted against the bonding surface of the second semiconductor structure 240. In this configuration, the device structures 106 of the first semiconductor structure 130 may abut directly against corresponding, respective device structures 206 of the second semiconductor structure 240. In some embodiments, no intermediate bonding material (e.g., adhesive) may be provided between the abutting device structures 106 of the first semiconductor structure 130 and the device structures 206 of the second semiconductor structure 240.

The device structures 106 of the first semiconductor structure 130 then may be directly bonded to the device structures 206 of the second semiconductor structure 240 to form the bonded semiconductor structure 300 shown in FIG. 2K. The bonding process results in the formation of bonded conductive structures that include the device structures 106 and the device structures 206 that have been bonded together. The device structures 206 of the second semiconductor structure 240 may be directly bonded to the device structures 106 of the first semiconductor structure 130 in a direct conductive material-to-conductive material ultra-low temperature direct bonding process carried out in an environment at a temperature or temperatures of about two hundred degrees Celsius (200° C.) or less, or even in an environment at a temperature or temperatures of about one hundred degrees Celsius (100° C.) or less. In some embodiments, such an ultra-low temperature direct bonding process may be carried out at in an environment at about room temperature (i.e., without any applied heat additional to that provided by the ambient environment).

Prior to bonding the first semiconductor structure 130 to the second semiconductor structure 240, the first semiconductor structure 130 and the second semiconductor structure 240 may be processed to remove surface impurities and undesirable surface compounds.

In some embodiments, the first semiconductor structure 130 may be directly bonded to the second semiconductor structure 240 without applying pressure between the bonding surfaces at the bonding interface therebetween. In other embodiments, pressure may be applied between the bonding surfaces at the bonding interface in some ultra-low temperature direct bonding methods in order to achieve a suitable bond strength at the bonding interface. In other words, the direct bonding methods used to bond the device structures 106 of the first semiconductor structure 130 to the device structures 206 of the second semiconductor structure 240 may comprise surface assisted bonding (SAB) bonding methods in some embodiments of the invention.

With continued reference to FIG. 2K, in some embodiments, a bond interface 302 may be identified between the bonded device structures 106 of the first semiconductor structure 130 and the device structures 206 of the second semiconductor structure 240. Such a bond interface 302 may only be visible under magnification of a prepared cross-section of the bonded semiconductor structure 300. In some instances, it may not be possible to see the bond interfaces 302 after the bonding process is complete, even with the aid of magnification. However, as shown in FIG. 2K, in some embodiments of the invention, the bond interfaces 302 between the bonded device structures 106 of the first semiconductor structure 130 and the device structures 206 of the second semiconductor structure 240 may be separated from a primary bonding interface plane 304 between the first semiconductor structure 130 and the second semiconductor structure 240. The primary bonding interface plane 304 is defined as the plane along which the major surface 214 of the additional dielectric material 212 of the second semiconductor device 240 abuts against the major surface 103 of the dielectric material 102 of the first semiconductor device 130. The bond interfaces 302 may be separated from the primary bonding interface plane 304 by a distance that is at least substantially equal to the distance $D_1$ of FIG. 2D and/or the distance $D_2$ of FIG. 2I.

As previously mentioned, the distance $D_2$ of FIG. 2I may be approximately equal to the distance $D_1$ of FIG. 2D in some embodiments. By causing the distance $D_2$ of FIG. 2I to be approximately equal to the distance $D_1$ of FIG. 2D, direct physical contact may be sufficiently established between the device structures 106 of the first semiconductor structure 130 and the device structures 206 of the second semiconductor structure 240 during the direct bonding process may be enhanced without any problems that might arise by any expansion of the materials during subsequent annealing or other thermal treatment processes, which may improve the bond established therebetween.

Additional embodiments of the invention are described below with reference to FIGS. 3A through 3K. In particular, FIGS. 3A through 3E illustrate the fabrication of a first semiconductor structure 450 shown in FIG. 3E, FIGS. 3F through 3I illustrate the fabrication of a second semiconductor structure 570 shown in FIG. 3I, and FIGS. 3J and 3K illustrate the first semiconductor structure 450 and the second semiconductor structure 570 being bonded together in a direct bonding process to form a bonded semiconductor structure 600 shown in FIG. 3K.

Figure 3A:
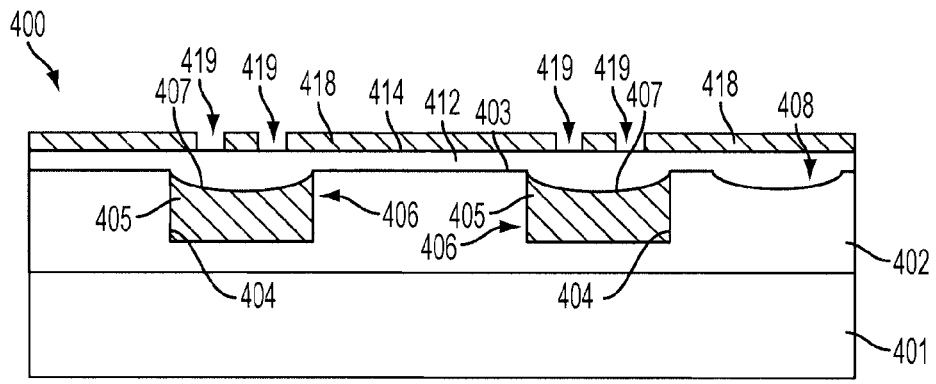
FIGS. 3A through 3K are simplified cross-sectional views of semiconductor structures and illustrate additional embodiments of direct bonding processes of the present invention.

Referring to FIG. 3A, a semiconductor structure 400 may be formed by providing a patterned mask material 418 over a semiconductor structure like the semiconductor structure 120 shown in FIG. 2C. Thus, but for the presence of the patterned mask material 418, the semiconductor structure 400 is at least substantially similar to the semiconductor structure 120 (FIG. 2C), and includes a device layer 401 (comprising one or more device structures, such as, transistors, vertically extending conductive vias, horizontally extending conductive traces, etc.), a dielectric material 402 over the device layer 401, and device structures 406 that are defined by and comprise a conductive material 405 disposed within recesses 404 formed or otherwise provided in the dielectric material 402. An additional dielectric material 412 having a planarized surface 414 may be provided over the dielectric material 402, such that the additional dielectric material 412 fills any recesses 408 in the major surface 403 of the dielectric material 402 and any recesses defined by concave surfaces 407 of the device structures 406. The patterned mask material 418 may be disposed over the major surface 414 of the additional dielectric material 412.

The mask material 418 may be blanket deposited over at least substantially the entire major surface 414 of the additional dielectric material 412, and subsequently patterned to form apertures 419 (e.g., holes or other openings) extending through the mask material 418. The apertures 419 may be aligned with the device structures 406, as shown in FIG. 3A. In some embodiments, the apertures 419 may have cross-sectional dimensions small enough to allow two or more apertures 419 to be disposed over and aligned with a single underlying device feature 406, as shown in FIG. 3A. The patterned mask material 418 may be used to facilitate removal of some regions of the additional dielectric material 412 overlying the device structures 406 without removing other regions of the additional dielectric material 412.

The mask material 418 may comprise, for example, a polymeric photoresist material such as poly(methyl methacrylate)

(PMMA), which may be deposited by spinning on a layer of uncured photoresist material, and subsequently subjecting certain selected regions of the uncured photoresist material to electromagnetic radiation through a patterned reticle to cure only selected regions of the uncured photoresist material. Uncured regions of the photoresist material then may be removed to form the patterned mask material 418 as shown in FIG. 3A. In additional embodiments, the mask material 418 may comprise a hard mask material, such as silicon nitride ($Si_3N_4$), and may be deposited using, for example, a chemical vapor deposition (CVD) process. Photolithographic techniques then may be used to pattern the deposited hard mask material to form the patterned mask material 418, as shown in FIG. 3A. Various mask materials, and methods for depositing and patterning such mask materials, are known in the art and may be employed in embodiments of the invention.

Figure 3B:
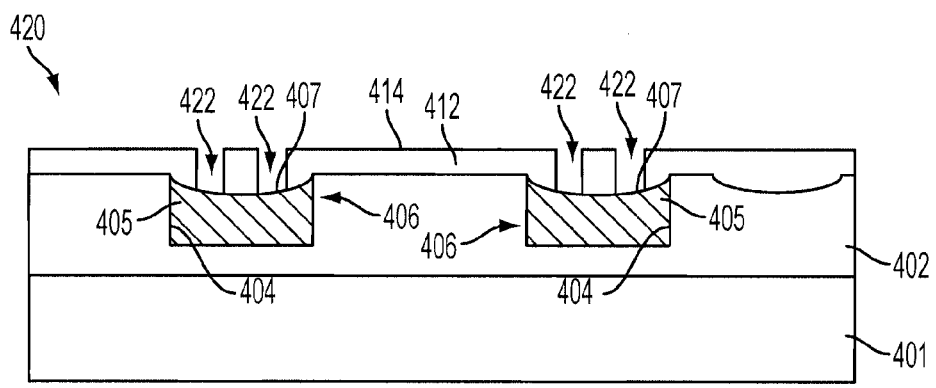

After forming the patterned mask material 418 over the planarized major surface 414 of the additional dielectric material 412, the regions of the additional dielectric material 412 that are exposed through the apertures 419 in the patterned mask material 418 overlying the device structures 406 may be removed to form a semiconductor structure 420, as shown in FIG. 3B. For example, the semiconductor structure 400 of FIG. 3A may be exposed to one or more etchants in a wet chemical etching process or a dry reactive ion etching (RIE) process. The one or more etchants may be selected to have a composition that will etch the additional dielectric material 412 without removing the patterned mask material 418 and conductive material 405, or that will etch the additional dielectric material 412 at a higher rate relative to the rate at which the patterned mask material 418 and conductive material 405 is etched by the one or more etchants, such that the regions of the additional dielectric material 412 overlying the device structures 406 that are exposed through the apertures 419 may be removed by the one or more etchants without etching entirely through the patterned mask material 418.

With continued reference to FIG. 3B, after the etching process described above with reference to FIG. 3A, the patterned mask material 418 may be removed from the semiconductor structure to form the semiconductor structure 420 of FIG. 3B. As shown therein, the etching process is used to form a plurality of apertures 422, each of which extends through the additional dielectric material 412 from the exposed major surface 414 thereof to the surface 407 of the device structures 406. After forming the recesses 422, conductive material may be provided within the recesses 422.

Figure 3C:
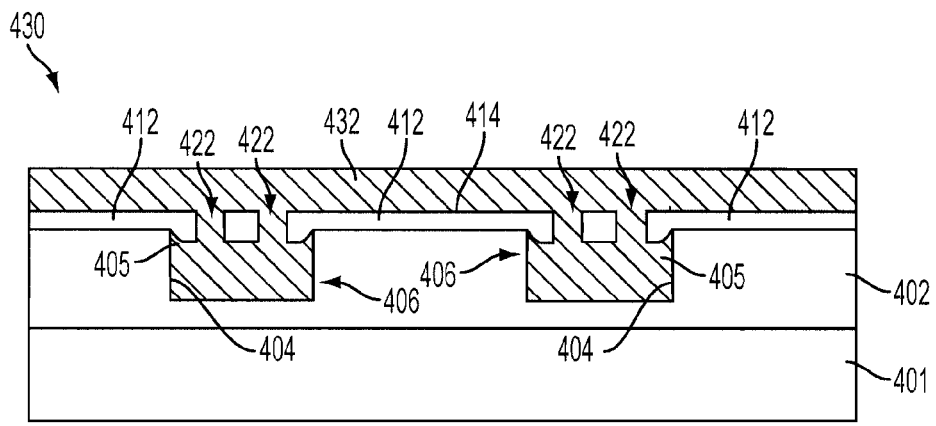

Referring to FIG. 3C, a conductive material 432 may be deposited within the recesses 422 to form the semiconductor structure 430 shown therein. In some embodiments, excess conductive material 432 may be deposited, such that a layer of the conductive material 432 covers the major surface 414 of the additional dielectric material 412, as shown in FIG. 3C.

The conductive material 432 may, in some embodiments, have a composition that is at least substantially the same as the composition of the conductive material 405 of the device structures 406. By way of example and not limitation, the conductive material 432 may comprise a commercially pure metal element such as copper, aluminum, tungsten, tantalum, titanium, chromium, etc., or the conductive material 432 may comprise an alloy or mixture based on one or more such metal elements, or the conductive material 432 may comprise a conductive semiconductor material (e.g., polysilicon). Further, the conductive material 432 may comprise different regions having different compositions. For example, the apertures 422 may be lined with one or more relatively thin layers of metal to provide, for example, a diffusion barrier layer, a seed layer, etc., and bulk electrically conductive metal, such as copper or a copper alloy, may be deposited over the one or more relatively thin layers.

The conductive material 432 may be deposited using one or more of an electroless plating process, an electrolytic plating process, a physical deposition process (PVD), and a chemical vapor deposition (CVD) process (including low-pressures CVD or "LPCVD" processes.

Figure 3D:
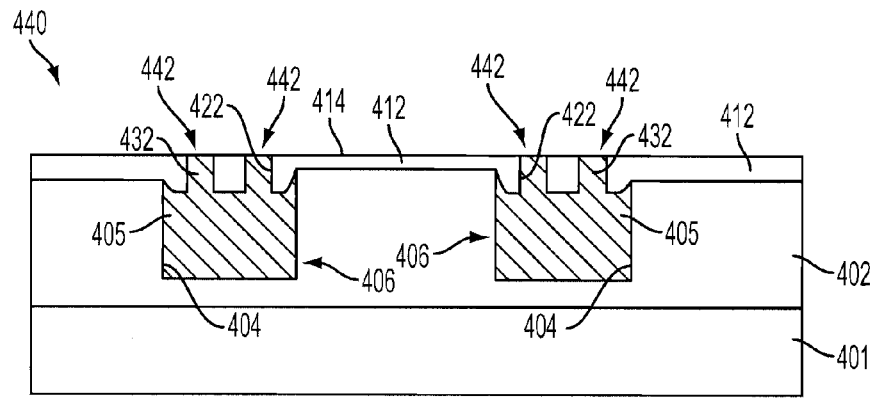

Referring to FIG. 3D, after depositing the additional conductive material 432, the excess conductive material 432 disposed over the major surface 414 of the additional dielectric material 412 may be removed using, for example, one or more of a chemical etching process, a mechanical polishing process, or a chemical-mechanical polishing (CMP) process to form the semiconductor structure 440 shown in FIG. 3D. For example, the excess conductive material 432 may be removed by subjecting the excess conductive material 432 to a chemical-mechanical polishing (CMP) process, which may be carried out at least until the major surface 414 of the additional dielectric material 412 is exposed through the conductive material 432, as shown in FIG. 3D. Upon removal of the excess conductive material 432, portions of the conductive material 432 remain disposed within the apertures 422 previously formed through the additional dielectric material 412. These remaining portions of the conductive material 432 form integral protrusions 442 of the device structures 406. In other words, upon removal of the excess conductive material 432, each of the device structures 406 includes a plurality of integral protrusions 442 defined by the conductive material 432 in the apertures 422, which integral protrusions 442 extend from a base structure defined by the conductive material 405 in the recesses 404.

The chemical-mechanical polishing (CMP) process used to remove the excess conductive material 432 may also planarize the exposed major surface 414 of the additional dielectric material 412.

Figure 3E:
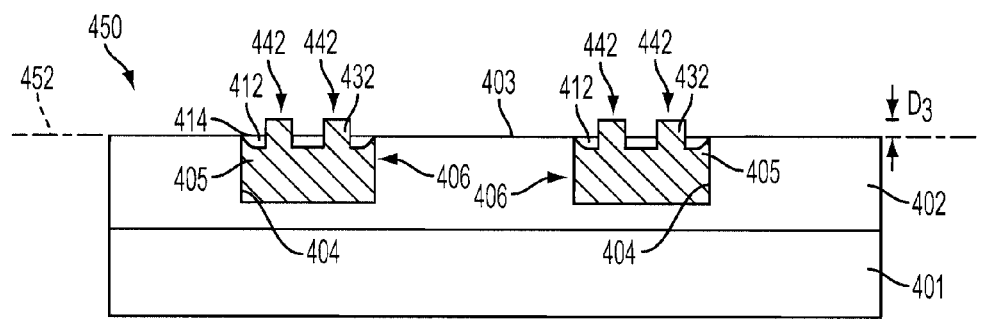

Referring to FIG. 3E, after removing the excess conductive metal 432, at least a portion of the additional dielectric material 412 laterally surrounding the integral protrusions 442 may be removed to cause the integral protrusions 442 to project a selected, predetermined distance $D_3$ from the exposed surface 403 of the dielectric material 402 and/or from the exposed surface 414 of the additional dielectric material 412, as shown in FIG. 3E, and form the previously mentioned first semiconductor structure 450.

In some embodiments, the distance $D_3$ may be between about one-half of a nanometer (0.5 nm) and about fifty nanometers (50 nm), between about one nanometer (1 nm) and about ten nanometers (10 nm), or even between about two nanometers (2 nm) and about seven nanometers (7 nm).

The exposed surfaces of the integral protrusions 442 of the device structures 406, the exposed major surface 403 of the surrounding dielectric material 402, and/or the exposed surface 414 of the additional dielectric material 412 together define a bonding surface of the first semiconductor structure 450 that will be abutted against and bonded to a complementary bonding surface of the second semiconductor structure 570 shown in FIG. 3I.

With continued reference to FIG. 3E, the integral protrusions 442 of the device structures 406, the dielectric material 402 disposed adjacent the integral protrusions 442, and the additional dielectric material 412 disposed adjacent the integral protrusions 442 are exposed at the bonding surface of the first semiconductor structure 450. Further, portions of the additional dielectric material 412 are disposed adjacent the device structures 406 and extend over a portion of the device structures 406 between the integral protrusions 442, as shown in FIG. 3E. The exposed major surface 403 of the dielectric material 402 and the exposed major surface 414 of the additional dielectric material 412 define a bond plane 452 of the first semiconductor structure 450. The bond plane 452 may comprise the plane along which at least a majority of the bonding interface between the first semiconductor structure 450 and the second semiconductor structure 570 (FIG. 3I) extends after bonding the first semiconductor structure 450 and the second semiconductor structure 570 together, as discussed in further detail below with reference to FIGS. 3J and 3K.

An example method that may be used to form the second semiconductor structure 570 of FIG. 3I is now described with reference to FIGS. 3F through 3I.

Figure 3F:
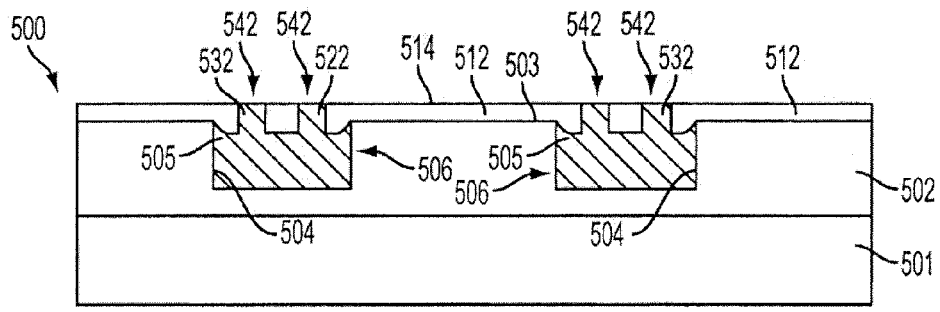

Referring to FIG. 3F, a semiconductor structure 500 may be provided that is at least substantially similar to the semiconductor structure 440 of FIG. 3D. Thus, the semiconductor structure 500 may include a device layer 501 that includes one or more device structures, such as, transistors, vertically extending conductive vias, horizontally extending conductive traces, etc. The semiconductor structure 500 includes a dielectric material 502 disposed over the device layer 501, and device structures 506 that are at least partially surrounded by the dielectric material 502. The conductive material 505 may have a composition as previously described in relation to the conductive material 105 of FIG. 2A.

The semiconductor structure 500 further includes an additional dielectric material 512 disposed over the surface 503 of the dielectric material 502. Each of the device structures 506 includes a plurality of integral protrusions 542 that extend from a base structure defined by the conductive material 505 in recesses 504 that extend into the dielectric material 502. The integral protrusions 542 are defined by a conductive material 532 disposed in apertures 522 that extend through the additional dielectric material 512. The composition of the conductive material 532 may be the same as, or different from, the composition of the conductive material 505. As shown in FIG. 3F, a major surface 514 of the additional dielectric material 512 and the integral protrusions 542 of the device structures 506 are exposed on the semiconductor structure 500.

Figure 3G:
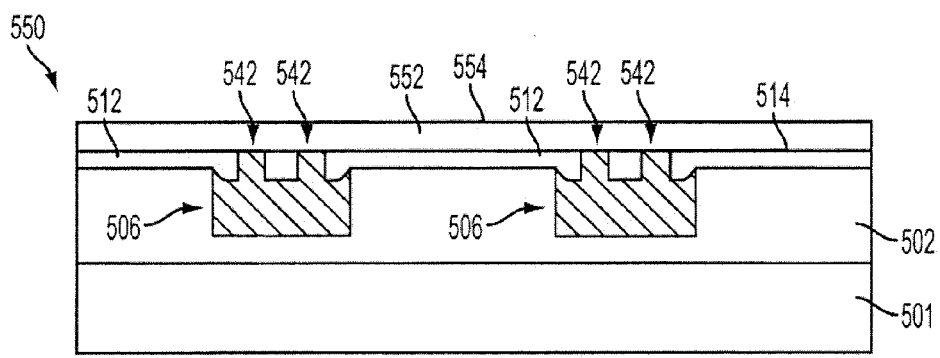

Referring to FIG. 3G, a semiconductor structure 550 may be formed from the semiconductor structure 500 of FIG. 3F by providing an additional dielectric material 552 over the surface 514 of the additional dielectric material 512. As shown in FIG. 3G, a layer of the additional dielectric material 552 may be provided over the additional dielectric material 512 to a desirable average thickness. The additional dielectric material 552 may have a composition and configuration (e.g., average thickness) as previously disclosed in relation to the additional dielectric material 112 with reference to FIG. 2B.

After depositing the additional dielectric material 552, the exposed major surface 554 of the additional dielectric material 552 optionally may be planarized. For example, the exposed major surface 554 of the additional dielectric material 552 may be subjected to one or more of a chemical etching process, a mechanical polishing process, or a chemical-mechanical polishing (CMP) process to planarize the exposed major surface 554 of the additional dielectric material 552. In some embodiments, after the planarization process, the exposed major surface 554 may have a root mean square (RMS) surface roughness of about one-half of a nanometer (0.5 nm) or less, about two tenths of a nanometer (0.2 nm) or less, or even about one tenth of a nanometer (0.1 nm) or less.

Figure 3H:
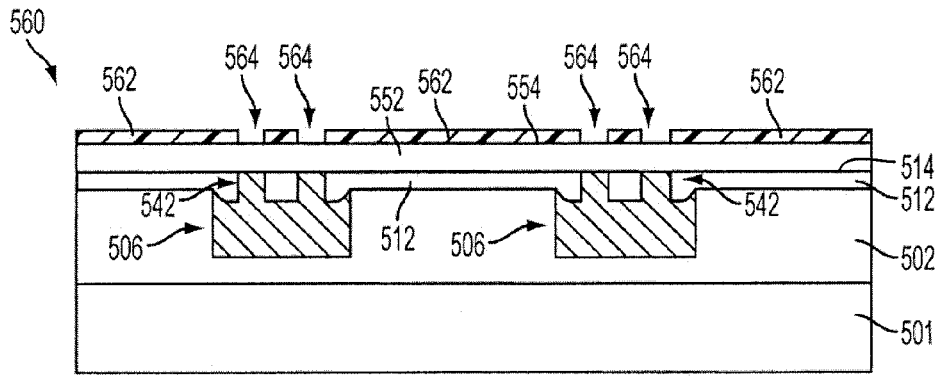
Figure 3I:
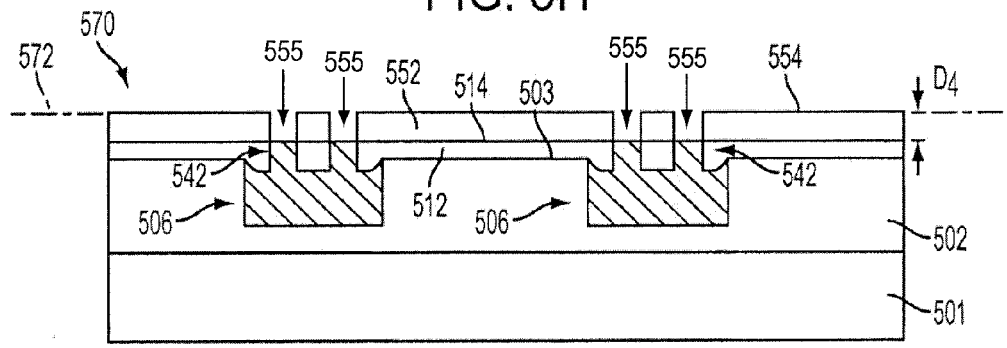
Figure 3J:
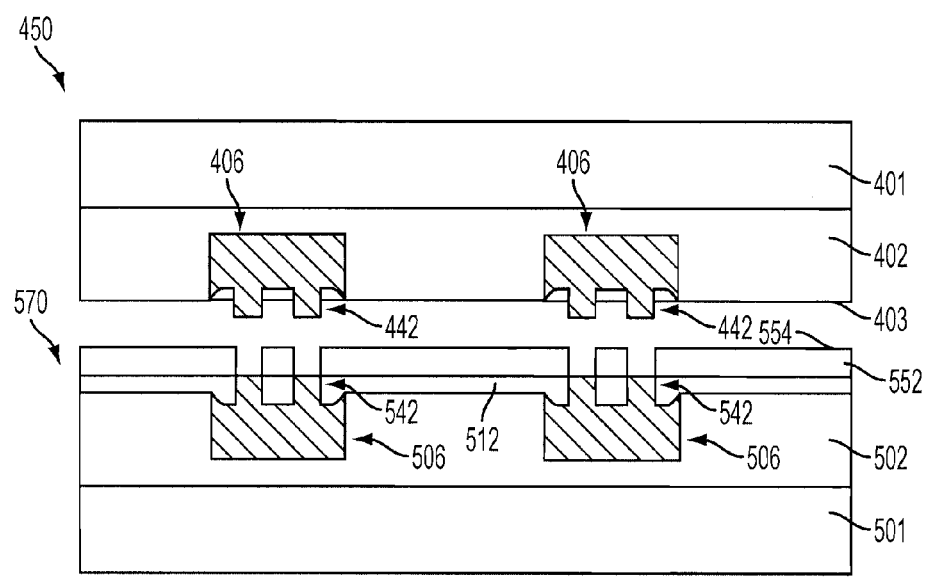
Figure 3K:
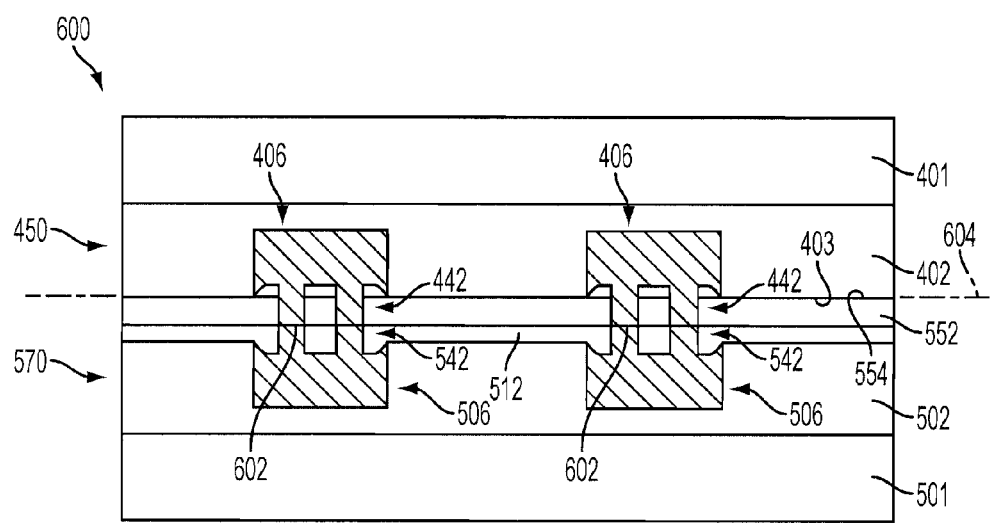

Referring to FIG. 3H, after planarizing the exposed major surface 554 of the additional dielectric material 552, a patterned mask material 562 may be provided over the planarized exposed major surface 554 to form the semiconductor structure 560 shown in FIG. 3H. The mask material 562 may be blanket deposited over at least substantially the entire exposed major surface 554, and subsequently patterned to form apertures 564 (e.g., holes or other openings) extending through the mask material 562. The apertures 564 may be aligned with the integral protrusions 542 of the device structures 506, as shown in FIG. 3H. Further, the apertures 564 may have sizes and shapes that correspond to the sizes and shapes of the underlying integral protrusions 542 of the device structures 506. The patterned mask material 562 may be used to facilitate removal of the regions of the additional dielectric material 552 overlying the integral protrusions 542 of the device structures 506 without removing other regions of the additional dielectric material 552 and the device structures 506.

The mask material 562 may comprise, for example, a polymeric photoresist material such as poly(methyl methacrylate) (PMMA), which may be deposited by spinning on a layer of uncured photoresist material, and subsequently subjecting certain selected regions of the uncured photoresist material to electromagnetic radiation through a patterned reticle to cure only selected regions of the uncured photoresist material. Uncured regions of the photoresist material then may be removed to form the patterned mask material 562 as shown in FIG. 3H. In additional embodiments, the mask material 562 may comprise a hard mask material, such as silicon nitride ($Si_3N_4$), and may be deposited using, for example, a chemical vapor deposition (CVD) process. Photolithographic techniques then may be used to pattern the deposited hard mask material to form the patterned mask material 562, as shown in FIG. 3H. Various mask materials, and methods for depositing and patterning such mask materials, are known in the art and may be employed in embodiments of the invention.

After forming the patterned mask material 562 over the exposed major surface 554 of the additional dielectric material 552, the regions of the additional dielectric material 552 that are exposed through the apertures 564 in the patterned mask material 562 overlying the integral protrusions 542 of the device structures 506 may be removed, as shown in the semiconductor structure 570 of FIG. 3I. For example, the semiconductor structure 560 of FIG. 3H may be exposed to one or more etchants in a wet chemical etching process or a dry reactive ion etching (RIE) process. The one or more etchants may be selected to have a composition that will etch the additional dielectric material 552 without removing the patterned mask material 562 and device structures 506, or that will etch the additional dielectric material 552 at a higher rate relative to the rate at which the patterned mask material 562 and device structures 506 are etched by the one or more etchants, such that at least substantially all of the additional dielectric material 552 overlying the integral protrusions 542 of the device structures 506 may be removed by the one or more etchants without etching entirely through the patterned mask material 562.

After removing the regions of the additional dielectric material 552 overlying the integral protrusions 542 of the device structures 506 that are exposed through the apertures 564 in the patterned mask material 562 in an etching process, the patterned mask material 562 may be removed, as shown in FIG. 3I. In some embodiments, after this etching process, the exposed major surface 554 of the additional dielectric material 552 may have a root mean square (RMS) surface roughness of about one-half of a nanometer (0.5 nm) or less, about two tenths of a nanometer (0.2 nm) or less, or even about one tenth of a nanometer (0.1 nm) or less.

Further, the etching process used to remove the regions of the additional dielectric material 552 overlying the integral protrusions 542 of the device structures 506 that are exposed through the apertures 564 in the patterned mask material 562 may cause the exposed surfaces of the integral protrusions 542 of the device structures 506 to be recessed a selected, predetermined distance $D_4$ from the exposed surface 554 of the surrounding additional dielectric material 552, as shown in FIG. 3I. Thus, apertures 555 are formed, each of which extends through the additional dielectric material 552 from the exposed major surface 554 thereof to a surface of the device structures 506.

As non-limiting examples, the distance $D_4$ may be between about one-half of a nanometer (0.5 nm) and about fifty nanometers (50 nm), between about one nanometer (1 nm) and about ten nanometers (10 nm), or even between about two nanometers (2 nm) and about seven nanometers (7 nm).

In some embodiments, the distance $D_4$ of FIG. 3I may be at least substantially equal to the distance $D_3$ of FIG. 3E. In additional embodiments, however, the distance $D_4$ of FIG. 3I may be greater than the distance $D_3$ of FIG. 3E. For example, the distance $D_3$ of FIG. 3E may be between about 80% and about 99% of the distance $D_4$ of FIG. 3I, or more particularly, between about 90% and about 98% of the distance $D_4$ of FIG. 3I.

The exposed major surface 554 of the additional dielectric material 552 and the exposed surfaces of the integral protrusions 542 of the device structures 506 together define a bonding surface of the second semiconductor structure 570 that will be abutted against and bonded to the complementary bonding surface of the first semiconductor structure 450 of FIG. 3E.

With continued reference to FIG. 3I, the integral protrusions 542 of the device structures 506 and the additional dielectric material 552 are exposed at the bonding surface of the second semiconductor structure 570. The exposed major surface 554 of the additional dielectric material 552 defines a bond plane 572 of the second semiconductor structure 570. The bond plane 572 may comprise the plane along which at least a majority of the bonding interface between the first semiconductor structure 450 (FIG. 3E) and the second semiconductor structure 570 extends after bonding the first semiconductor structure 450 and the second semiconductor structure 570 together, as discussed in further detail below with reference to FIGS. 3J and 3K.

Referring to FIG. 3J, the first semiconductor structure 450 may be aligned with the second semiconductor structure 570 such that the integral protrusions 442 of the device structures 406 of the first semiconductor structure 450 are aligned with the integral protrusions 542 of the device structures 506 of the second semiconductor structure 570. As previously mentioned, the exposed surfaces of the integral protrusions 442 of the device structures 406 and the exposed major surface 403 of the surrounding dielectric material 402 together define a bonding surface of the first semiconductor structure 450, and the exposed surfaces of the integral protrusions 542 of the device structures 506 and the exposed major surface 554 of the surrounding additional dielectric material 552 together define a bonding surface of the second semiconductor structure 570. Thus configured, the topography of the bonding surface of the first semiconductor structure 450 has a male configuration in which the integral protrusions 442 of the device structures 406 project from the first semiconductor structure 450, and the topography of the bonding surface of the second semiconductor structure 570 has a female configuration in which the integral protrusions 542 of the device structures 506 are disposed in recesses that extend into the second semiconductor structure 570.

Referring to FIG. 3K, the projecting integral protrusions 442 of the device structures 406 of the first semiconductor structure 450 may be inserted into the recesses in which the integral protrusions 542 of the device structures 506 of the second semiconductor structure 570 are disposed, and the bonding surface of the first semiconductor structure 450 may be abutted against the bonding surface of the second semiconductor structure 570. In this configuration, the integral protrusions 442 of the device structures 406 of the first semiconductor structure 450 may abut directly against corresponding, respective integral protrusions 542 of the device structures 506 of the second semiconductor structure 570. In some embodiments, no intermediate bonding material (e.g., adhesive) may be provided between the abutting integral protrusions 442 of the device structures 406 of the first semiconductor structure 450 and the integral protrusions 542 of the device structures 506 of the second semiconductor structure 570.

The integral protrusions 442 of the device structures 406 of the first semiconductor structure 450 then may be directly bonded to the integral protrusions 542 of the device structures 506 of the second semiconductor structure 570 to form the bonded semiconductor structure 600 shown in FIG. 3K. The bonding process results in the formation of bonded conductive structures that include the device structures 406 and the device structures 506 that have been bonded together. The integral protrusions 542 of the device structures 506 of the second semiconductor structure 570 may be directly bonded to the integral protrusions 442 of the device structures 406 of the first semiconductor structure 450 in a direct conductive material-to-conductive material ultra-low temperature direct bonding process carried out in an environment at a temperature or temperatures of about two hundred degrees Celsius (200° C.) or less, or even in an environment at a temperature or temperatures of about one hundred degrees Celsius (100° C.) or less. In some embodiments, such an ultra-low temperature direct bonding process may be carried out at in an environment at about room temperature (i.e., without any applied heat additional to that provided by the ambient environment).

Prior to bonding the first semiconductor structure 450 to the second semiconductor structure 570, the first semiconductor structure 450 and the second semiconductor structure 570 may be processed to remove surface impurities and undesirable surface compounds.

In some embodiments, the first semiconductor structure 450 may be directly bonded to the second semiconductor structure 570 without applying pressure between the bonding surfaces at the bonding interface therebetween. In other embodiments, pressure may be applied between the bonding surfaces at the bonding interface in some ultra-low temperature direct bonding methods in order to achieve a suitable bond strength at the bonding interface. In other words, the direct bonding methods used to bond the integral protrusions 442 of the device structures 406 of the first semiconductor structure 450 to the integral protrusions 542 of the device structures 506 of the second semiconductor structure 570 may comprise surface assisted bonding (SAB) bonding methods in some embodiments of the invention.

With continued reference to FIG. 3K, in some embodiments, a bond interface 602 may be identified between the bonded integral protrusions 442 of the device structures 406 of the first semiconductor structure 450 and the integral protrusions 542 of the device structures 506 of the second semiconductor structure 570. Such a bond interface 602 may only be visible under magnification of a prepared cross-section of the bonded semiconductor structure 600. In some instances, it may not be possible to see the bond interfaces 602 after the bonding process is complete, even with the aid of magnification. However, as shown in FIG. 3K, in some embodiments of the invention, the bond interfaces 602 between the bonded integral protrusions 442 of the device structures 406 of the first semiconductor structure 450 and the integral protrusions 542 of the device structures 506 of the second semiconductor structure 570 may be separated from a primary bonding interface plane 604 between the first semiconductor structure 450 and the second semiconductor structure 570. The primary bonding interface plane 604 is defined as the plane along which the major surface 554 of the dielectric material 552 of the second semiconductor device 570 abuts against the major surface 403 of the dielectric material 402 of the first semiconductor device 450. The bond interfaces 602 may be separated from the primary bonding interface plane 604 by a distance that is at least substantially equal to the distance $D_3$ of FIG. 3E and/or the distance $D_4$ of FIG. 3I.

In additional embodiments of the invention, the bonded interface between the directly bonded conductive device structures of the first and second semiconductor structures may be at least substantially coplanar with the primary bonding interface between the first and second semiconductor structures. Non-limiting examples of such embodiments are described below with reference to FIGS. 4A and 4B. In particular, FIGS. 4A and 4B illustrate the direct bonding of a first semiconductor structure 440 as previously described in relation to FIG. 3D and a second semiconductor structure 500 as previously described in relation to FIG. 3F (which may, in some embodiments, be at least substantially similar to the first semiconductor structure 440) to form a bonded semiconductor structure 700 shown in FIG. 4B.

Figure 4A:
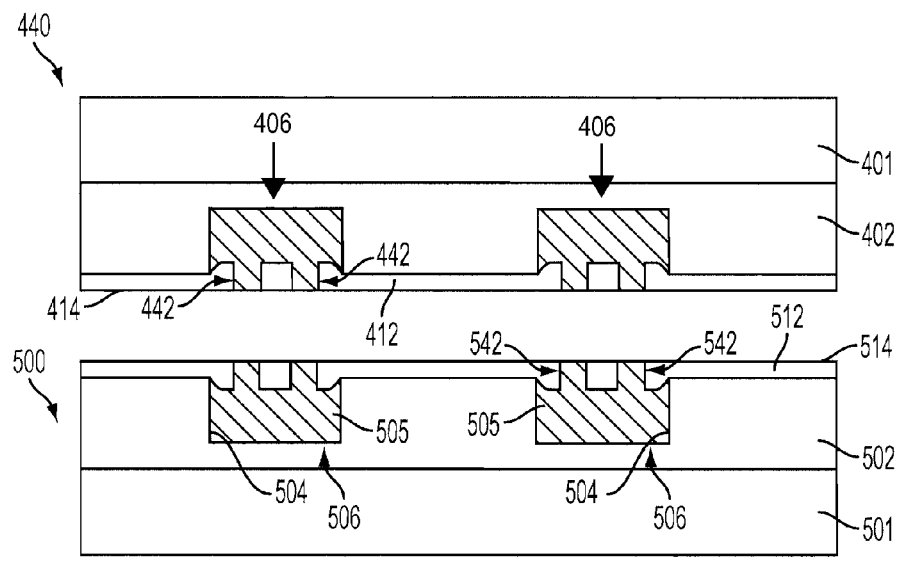
FIGS. 4A and 4B are simplified cross-sectional views of semiconductor structures and illustrate yet further embodiments of direct bonding processes of the present invention.

Referring to FIG. 4A, the first semiconductor structure 440 may be aligned with the second semiconductor structure 500 such that the integral protrusions 442 of the device structures 406 of the first semiconductor structure 440 are aligned with the integral protrusions 542 of the device structures 506 of the second semiconductor structure 500. The exposed surfaces of the integral protrusions 442 of the device structures 406 and the exposed major surface 414 of the surrounding additional dielectric material 412 together define an at least substantially planar bonding surface of the first semiconductor structure 440, and the exposed surfaces of the integral protrusions 542 of the device structures 506 and the exposed major surface 514 of the surrounding additional dielectric material 512 together define an at least substantially planar bonding surface of the second semiconductor structure 500.

Figure 4B:
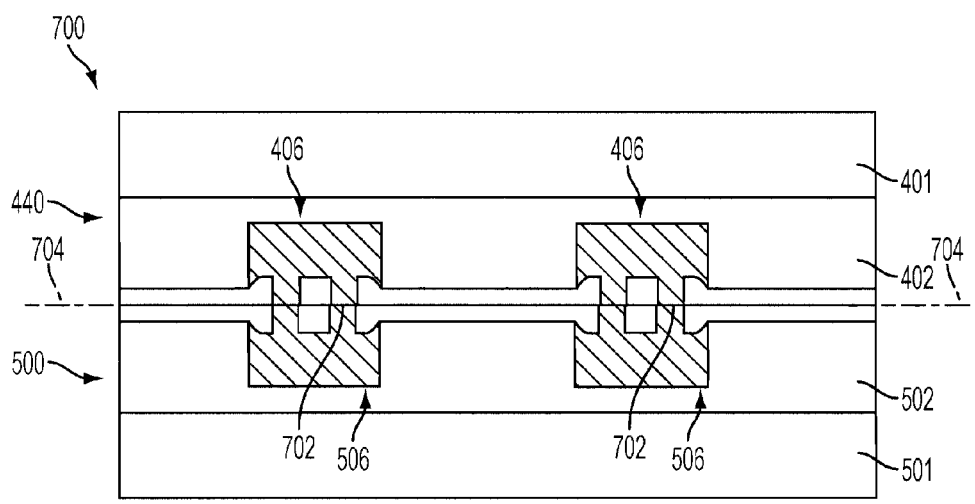

Referring to FIG. 4B, the bonding surface of the first semiconductor structure 440 may be abutted against the bonding surface of the second semiconductor structure 500 such that the integral protrusions 442 of the device structures 406 of the first semiconductor structure 440 are abutted directly against and in direct physical contact with the integral protrusions 542 of the device structures 506 of the second semiconductor structure 500 without any intermediate bonding material (e.g., adhesive) therebetween.

The integral protrusions 442 of the device structures 406 of the first semiconductor structure 440 then may be directly bonded to the integral protrusions 542 of the device structures 506 of the second semiconductor structure 500 to form the bonded semiconductor structure 700 shown in FIG. 4B. The bonding process may be carried out as previously described with reference to FIGS. 2K and 3K.

In the embodiments of FIGS. 4A and 4B, the bond interfaces 702 between the bonded integral protrusions 442 of the device structures 406 of the first semiconductor structure 440 and the integral protrusions 542 of the device structures 506 of the second semiconductor structure 500 may be at least substantially coplanar with a primary bonding interface plane 704 between the first semiconductor structure 440 and the second semiconductor structure 500, as shown in FIG. 4B. The primary bonding interface plane 704 is defined as the plane along which the major surface 514 of the dielectric material 512 of the second semiconductor device 500 abuts against the major surface 414 of the dielectric material 412 of the first semiconductor device 440.

Additional non-limiting example embodiments of the invention are described below:

Embodiment 1: A method of directly bonding a first semiconductor structure to a second semiconductor structure, comprising: providing a first semiconductor structure comprising: at least one device structure comprising a conductive material, the at least one device structure exposed at a bonding surface of the first semiconductor structure; and a dielectric material exposed at the bonding surface of the first semiconductor structure, the dielectric material disposed adjacent the at least one device structure of the first semiconductor structure, an exposed surface of the dielectric material at the bonding surface of the first semiconductor structure defining a bond plane of the first semiconductor structure; causing the at least one device structure of the first semiconductor structure to project a distance from the bond plane of the first semiconductor structure beyond the adjacent dielectric material; providing a second semiconductor structure comprising: at least one device structure comprising a conductive material, the at least one device structure exposed at a bonding surface of the second semiconductor structure; and a dielectric material exposed at the bonding surface of the second semiconductor structure, the dielectric material disposed adjacent the at least one device structure of the second semiconductor structure, an exposed surface of the dielectric material at the bonding surface of the second semiconductor structure defining a bond plane of the second semiconductor structure; and bonding the at least one device structure of the first semiconductor structure directly to the at least one device structure of the second semiconductor structure in a conductive material-to-conductive material direct bonding process.

Embodiment 2: The method of Embodiment 1, wherein causing the at least one device structure of the first semiconductor structure to project the distance from the bond plane of the first semiconductor structure beyond the adjacent dielectric material comprises removing a portion of the dielectric material from the first semiconductor structure.

Embodiment 3: The method of Embodiment 2, wherein removing the portion of the dielectric material from the first semiconductor structure comprises etching the dielectric material.

Embodiment 4: The method of any one of Embodiments 1 through 3, wherein causing the at least one device structure of the first semiconductor structure to project a distance from the bond plane of the first semiconductor structure comprises causing the at least one device structure of the first semiconductor structure to project a selected, predetermined distance from the bond plane of the first semiconductor structure.

Embodiment 5: The method of any one of Embodiments 1 through 4, further comprising causing the at least one device structure of the second semiconductor structure to be recessed a distance from the bond plane of the second semiconductor structure into a recess extending into the adjacent dielectric material.

Embodiment 6: The method of Embodiment 5, wherein causing the at least one device structure of the second semiconductor structure to be recessed the distance from the bond plane of the second semiconductor structure into the recess extending into the adjacent dielectric material comprises: depositing dielectric material over the at least one device structure of the second semiconductor structure; and etching through the dielectric material to the at least one device structure.

Embodiment 7: The method of Embodiment 5 or Embodiment 6, wherein causing the at least one device structure of the second semiconductor structure to be recessed the distance from the bond plane of the second semiconductor structure into the recess extending into the adjacent dielectric material comprises causing the at least one device structure of the second semiconductor structure to be recessed a selected, predetermined distance from the bond plane of the second semiconductor structure.

Embodiment 8: The method of any one of Embodiments 5 through 7, wherein bonding the at least one device structure of the first semiconductor structure directly to the at least one device structure of the second semiconductor structure comprises inserting the at least one device structure of the first semiconductor structure into the recess in the dielectric material of the second semiconductor structure.

Embodiment 9: The method of any one of Embodiments 1 through 8, further comprising forming the at least one device structure of the first semiconductor structure to comprise a plurality of integral protrusions, each integral protrusion of the plurality of integral protrusions projecting the distance from the bond plane of the first semiconductor structure beyond the adjacent dielectric material.

Embodiment 10: The method of Embodiment 9, further comprising: providing dielectric material over the at least one device structure of the second semiconductor structure; and etching through the dielectric material to form a plurality of recesses extending through the dielectric material to the at least one device structure of the second semiconductor structure.

Embodiment 11: The method of Embodiment 10, wherein bonding the at least one device structure of the first semiconductor structure directly to the at least one device structure of the second semiconductor structure comprises inserting each integral protrusion of the plurality of integral protrusions of the at least one device structure of the first semiconductor structure into a corresponding complementary recess of the plurality of recesses extending through the dielectric material to the at least one device structure of the second semiconductor structure.

Embodiment 12: The method of any one of Embodiments 1 through 11, wherein bonding the at least one device structure of the first semiconductor structure directly to the at least one device structure of the second semiconductor structure in a conductive material-to-conductive material direct bonding process comprises bonding the at least one device structure of the first semiconductor structure directly to the at least one device structure of the second semiconductor structure in a non thermo-compression direct bonding process.

Embodiment 13: The method of any one of Embodiments 1 through 12, wherein bonding the at least one device structure of the first semiconductor structure directly to the at least one device structure of the second semiconductor structure in a conductive material-to-conductive material direct bonding process comprises bonding the at least one device structure of the first semiconductor structure directly to the at least one device structure of the second semiconductor structure in an ultra-low temperature direct bonding process.

Embodiment 14: The method of any one of Embodiments 1 through 13, wherein bonding the at least one device structure of the first semiconductor structure directly to the at least one device structure of the second semiconductor structure in a conductive material-to-conductive material direct bonding process comprises bonding the at least one device structure of the first semiconductor structure directly to the at least one device structure of the second semiconductor structure in a surface-assisted direct bonding process.

Embodiment 15: A method of directly bonding a first semiconductor structure to a second semiconductor structure, comprising: providing a first semiconductor structure comprising: at least one device structure comprising a conductive material, the at least one device structure comprising a plurality of integral protrusions extending from a base structure, the plurality of integral protrusions exposed at a bonding surface of the first semiconductor structure; and a dielectric material exposed at the bonding surface of the first semiconductor structure, the dielectric material disposed adjacent the at least one device structure of the first semiconductor structure and extending over a portion of the at least one device structure between the integral protrusions of the plurality of integral protrusions of the at least one device structure of the first semiconductor structure, an exposed surface of the dielectric material at the bonding surface of the first semiconductor structure defining a bond plane of the first semiconductor structure; providing a second semiconductor structure comprising: at least one device structure comprising a conductive material, the at least one device structure comprising a plurality of integral protrusions extending from a base structure, the plurality of integral protrusions exposed at a bonding surface of the second semiconductor structure; and a dielectric material exposed at the bonding surface of the second semiconductor structure, the dielectric material disposed adjacent the at least one device structure of the second semiconductor structure and extending over a portion of the at least one device structure between the integral protrusions of the plurality of integral protrusions of the at least one device structure of the second semiconductor structure, an exposed surface of the dielectric material at the bonding surface of the second semiconductor structure defining a bond plane of the second semiconductor structure; and bonding the plurality of integral protrusions of the at least one device structure of the first semiconductor structure directly to the plurality of integral protrusions of the at least one device structure of the second semiconductor structure in a conductive material-to-conductive material direct bonding process.

Embodiment 16: The method of Embodiment 15, wherein providing the first semiconductor structure comprises forming the plurality of integral protrusions extending from the base structure of the at least one device structure of the first semiconductor structure, forming the plurality of integral protrusions comprising: providing the dielectric material over the base structure of the at least one device structure of the first semiconductor structure; etching through the dielectric material to form a plurality of recesses extending through the dielectric material to the base structure of the at least one device structure of the first semiconductor structure; and providing the conductive material in the plurality of recesses to form the plurality of integral protrusions extending from the base structure of the at least one device structure of the first semiconductor structure.

Embodiment 17: The method of Embodiment 15 or Embodiment 16, wherein bonding the plurality of integral protrusions of the at least one device structure of the first semiconductor structure directly to the plurality of integral protrusions of the at least one device structure of the second semiconductor structure in a conductive material-to-conductive material direct bonding process comprises bonding the plurality of integral protrusions of the at least one device structure of the first semiconductor structure directly to the plurality of integral protrusions of the at least one device structure of the second semiconductor structure in at least one of an ultra-low temperature direct bonding process and a surface-assisted direct bonding process.

Embodiment 18: A bonded semiconductor structure, comprising: a first semiconductor structure, comprising: at least one conductive device structure at a bonding surface of the first semiconductor structure; and a dielectric material disposed adjacent the at least one conductive device structure at the bonding surface of the first semiconductor structure; a second semiconductor structure, comprising: at least one conductive device structure at a bonding surface of the second semiconductor structure, the at least one conductive device structure of the second semiconductor structure directly bonded to the at least one conductive device structure of the first semiconductor structure along a bonding interface therebetween; and a dielectric material disposed adjacent the at least one conductive device structure at the bonding surface of the second semiconductor structure, the dielectric material of the second semiconductor structure abutting the dielectric material of the first semiconductor structure along a bond plane; wherein the bonding interface between the at least one conductive device structure of the first semiconductor structure and the at least one conductive device structure of the second semiconductor structure is separated from the bond plane by a distance.

Embodiment 19: The bonded semiconductor structure of Embodiment 18, wherein each of the at least one conductive device structure of the first semiconductor structure and the at least one conductive device structure of the second semiconductor structure is at least substantially comprised of copper or a copper alloy.

Embodiment 20: The bonded semiconductor structure of Embodiment 18 or Embodiment 19, wherein the at least one conductive device structure of the first semiconductor structure comprises a plurality of integral protrusions extending from a base structure.

Embodiment 21: The bonded semiconductor structure of Embodiment 20, wherein the plurality of integral protrusions of the at least one conductive device structure of the first semiconductor structure extend through a plurality of recesses in the dielectric material of the second semiconductor structure.

Embodiment 22: The bonded semiconductor structure of Embodiment 21, wherein the at least one conductive device structure of the second semiconductor structure comprises a plurality of integral protrusions extending from a base structure, the plurality of integral protrusions of the at least one conductive device structure of the second semiconductor structure directly bonded to the integral protrusions of the at least one conductive device structure of the first semiconductor structure.

Embodiment 23: A bonded semiconductor structure, comprising: a first semiconductor structure, comprising: at least one conductive device structure at a bonding surface of the first semiconductor structure, the at least one conductive device structure comprising a plurality of integral protrusions extending from a base structure; and a dielectric material disposed adjacent the at least one conductive device structure at the bonding surface of the first semiconductor structure, at least a portion of the dielectric material disposed between the integral protrusions of the at least one conductive device structure of the first semiconductor structure; a second semiconductor structure, comprising: at least one conductive device structure at a bonding surface of the second semiconductor structure, the at least one conductive device structure comprising a plurality of integral protrusions extending from a base structure; and a dielectric material disposed adjacent the at least one conductive device structure at the bonding surface of the second semiconductor structure, at least a portion of the dielectric material disposed between the integral protrusions of the at least one conductive device structure of the second semiconductor structure, the dielectric material of the second semiconductor structure abutting the dielectric material of the first semiconductor structure along a bond plane; wherein the integral protrusions of the at least one conductive device structure of the first semiconductor structure are directly bonded to the integral protrusions of the at least one conductive device structure of the second semiconductor structure along bonded interfaces therebetween.

Embodiment 24: The bonded semiconductor structure of Embodiment 23, wherein the bonded interfaces between the integral protrusions of the at least one conductive device structure of the first semiconductor structure and the integral protrusions of the at least one conductive device structure of the second semiconductor structure are separated from the bond plane.

Embodiment 25: The bonded semiconductor structure of Embodiment 23, wherein the bonded interfaces between the integral protrusions of the at least one conductive device structure of the first semiconductor structure and the integral protrusions of the at least one conductive device structure of the second semiconductor structure are at least substantially coplanar with the bond plane.

The example embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the invention. Such modifications and embodiments are also intended to fall within the scope of the appended claims.

What is claimed is:

1. A method of directly bonding a first semiconductor structure to a second semiconductor structure, comprising:
   providing the first semiconductor structure comprising:
   at least one device structure of the first semiconductor structure comprising a conductive material, the at least one device structure exposed at a bonding surface of the first semiconductor structure; and
   a first dielectric material disposed adjacent the at least one device structure of the first semiconductor structure, a surface of the first dielectric material comprising a recess or pit;
   forming a second dielectric material over the surface of the first dielectric material of the first semiconductor structure to at least partially fill the recess or pit on the surface of the first dielectric material;
   planarizing an exposed surface of the second dielectric material to provide a substantially planar surface at the bonding surface of the first semiconductor structure defining a bond plane of the first semiconductor structure;
   causing the at least one device structure of the first semiconductor structure to project a first distance from the bond plane of the first semiconductor structure beyond a portion of the first dielectric material adjacent the at least one device structure;

forming the at least one device structure of the first semiconductor structure to comprise a plurality of integral protrusions, each integral protrusion of the plurality of integral protrusions projecting the first distance from the bond plane of the first semiconductor structure beyond the portion of the first dielectric material;

providing the second semiconductor structure comprising:
   at least one device structure of the second semiconductor structure comprising a conductive material, the at least one device structure exposed at a bonding surface of the second semiconductor structure; and
   a third dielectric material disposed adjacent the at least one device structure of the second semiconductor structure;

providing a fourth dielectric material over the at least one device structure of the second semiconductor structure, an exposed surface of the fourth dielectric material at the bonding surface of the second semiconductor structure defining a bond plane of the second semiconductor structure;

etching through the fourth dielectric material to form a plurality of apertures extending through the fourth dielectric material to the at least one device structure of the second semiconductor structure; and bonding the at least one device structure of the first semiconductor structure directly to the at least one device structure of the second semiconductor structure in a conductive material-to-conductive material direct bonding process.

2. The method of claim 1, wherein causing the at least one device structure of the first semiconductor structure to project the first distance from the bond plane of the first semiconductor structure comprises removing a portion of the second dielectric material from the first semiconductor structure.

3. The method of claim 2, wherein removing the portion of the second dielectric material from the first semiconductor structure comprises etching the second dielectric material.

4. The method of claim 1, wherein causing the at least one device structure of the first semiconductor structure to project the first distance from the bond plane of the first semiconductor structure comprises causing the at least one device structure of the first semiconductor structure to project a selected, predetermined distance from the bond plane of the first semiconductor structure.

5. The method of claim 1, further comprising causing the at least one device structure of the second semiconductor structure to be recessed a second distance from the bond plane of the second semiconductor structure into an aperture of the plurality of apertures extending into the fourth dielectric material.

6. The method of claim 5, wherein causing the at least one device structure of the second semiconductor structure to be recessed the second distance from the bond plane of the second semiconductor structure into the aperture of the plurality of apertures extending into the fourth dielectric material comprises causing the at least one device structure of the second semiconductor structure to be recessed a selected, predetermined distance from the bond plane of the second semiconductor structure.

7. The method of claim 5, wherein bonding the at least one device structure of the first semiconductor structure directly to the at least one device structure of the second semiconductor structure comprises inserting the at least one device structure of the first semiconductor structure into the aperture in the fourth dielectric material of the second semiconductor structure.

8. The method of claim 1, wherein bonding the at least one device structure of the first semiconductor structure directly to the at least one device structure of the second semiconductor structure comprises inserting each integral protrusion of the plurality of integral protrusions of the at least one device structure of the first semiconductor structure into a corresponding complementary aperture of the plurality of apertures extending through the fourth dielectric material to the at least one device structure of the second semiconductor structure.

9. The method of claim 1, wherein bonding the at least one device structure of the first semiconductor structure directly to the at least one device structure of the second semiconductor structure in the conductive material-to-conductive material direct bonding process comprises bonding the at least one device structure of the first semiconductor structure directly to the at least one device structure of the second semiconductor structure in a non thermo-compression direct bonding process.

10. The method of claim 1, wherein bonding the at least one device structure of the first semiconductor structure directly to the at least one device structure of the second semiconductor structure in the conductive material-to-conductive material direct bonding process comprises bonding the at least one device structure of the first semiconductor structure directly to the at least one device structure of the second semiconductor structure in an ultra-low temperature direct bonding process.

11. The method of claim 1, wherein bonding the at least one device structure of the first semiconductor structure directly to the at least one device structure of the second semiconductor structure in the conductive material-to-conductive material direct bonding process comprises bonding the at least one device structure of the first semiconductor structure directly to the at least one device structure of the second semiconductor structure in a surface-assisted direct bonding process.

12. A method of directly bonding a first semiconductor structure to a second semiconductor structure, comprising:
   providing the first semiconductor structure comprising:
      at least one device structure of the first semiconductor structure comprising a conductive material, the at least one device structure comprising a plurality of integral protrusions extending from a base structure, the plurality of integral protrusions exposed at a bonding surface of the first semiconductor structure;
      a first dielectric material disposed adjacent the at least one device structure of the first semiconductor structure, a surface of the first dielectric material comprising a recess or pit; and
      a second dielectric material over the surface of the first dielectric material of the first semiconductor structure to at least partially fill the recess or pit on the surface of the first dielectric material and over a portion of the at least one device structure between the integral protrusions of the plurality of integral protrusions of the at least one device structure of the first semiconductor structure;
   wherein providing the first semiconductor structure comprises forming the plurality of integral protrusions extending from the base structure of the at least one device structure of the first semiconductor structure, forming the plurality of integral protrusions comprising:

providing the second dielectric material over the base structure of the at least one device structure of the first semiconductor structure;

etching through the second dielectric material to form a plurality of apertures extending through the second dielectric material to the base structure of the at least one device structure of the first semiconductor structure; and providing the conductive material in the plurality of apertures to form the plurality of integral protrusions extending from the base structure of the at least one device structure of the first semiconductor structure;

planarizing an exposed surface of the second dielectric material to provide a substantially planar surface at the bonding surface of the first semiconductor structure defining a bond plane of the first semiconductor structure;

providing the second semiconductor structure comprising:

at least one device structure of the second semiconductor structure comprising a conductive material, the at least one device structure comprising a plurality of integral protrusions extending from a base structure, the plurality of integral protrusions exposed at a bonding surface of the second semiconductor structure; and a third dielectric material exposed at the bonding surface of the second semiconductor structure, the third dielectric material disposed adjacent the at least one device structure of the second semiconductor structure and extending over a portion of the at least one device structure between the integral protrusions of the plurality of integral protrusions of the at least one device structure of the second semiconductor structure, an exposed surface of the third dielectric material at the bonding surface of the second semiconductor structure defining a bond plane of the second semiconductor structure; and bonding the plurality of integral protrusions of the at least one device structure of the first semiconductor structure directly to the plurality of integral protrusions of the at least one device structure of the second semiconductor structure in a conductive material-to-conductive material direct bonding process.

13. The method of claim 12, wherein bonding the plurality of integral protrusions of the at least one device structure of the first semiconductor structure directly to the plurality of integral protrusions of the at least one device structure of the second semiconductor structure in the conductive material-to-conductive material direct bonding process comprises bonding the plurality of integral protrusions of the at least one device structure of the first semiconductor structure directly to the plurality of integral protrusions of the at least one device structure of the second semiconductor structure in at least one of an ultra-low temperature direct bonding process and a surface-assisted direct bonding process.

* * * * *

UNITED STATES PATENT AND TRADEMARK OFFICE
CERTIFICATE OF CORRECTION

PATENT NO. : 8,697,493 B2  
APPLICATION NO. : 13/185044  
DATED : April 15, 2014  
INVENTOR(S) : Mariam Sadaka Page 1 of 1

It is certified that error appears in the above-identified patent and that said Letters Patent is hereby corrected as shown below:

In the specification:

COLUMN 16, LINE 7, change "(including" to --including--  
COLUMN 16, LINE 7, change "low-pressures" to --low-pressure--

Signed and Sealed this  
Twenty-ninth Day of December, 2015

Michelle K. Lee  
*Director of the United States Patent and Trademark Office*